(12) United States Patent
Honjo et al.

(10) Patent No.: US 7,694,415 B2
(45) Date of Patent: Apr. 13, 2010

(54) METHOD OF MANUFACTURING COMPONENT-EMBEDDED PRINTED WIRING BOARD

(75) Inventors: Kazuhiko Honjo, Gifu (JP); Toshihiko Mori, Osaka (JP); Eiji Kawamoto, Osaka (JP); Junichi Kimura, Aichi (JP); Motoyoshi Kitagawa, Gifu (JP)

(73) Assignee: Panasonic Corporation, Osaka (JP)

( * ) Notice: Subject to any disclaimer, the term of this patent is extended or adjusted under 35 U.S.C. 154(b) by 729 days.

(21) Appl. No.: 11/434,763

(22) Filed: May 17, 2006

(65) Prior Publication Data

US 2006/0260122 A1 Nov. 23, 2006

(30) Foreign Application Priority Data

May 20, 2005 (JP) ............................. 2005-147864

(51) Int. Cl.
*H05K 3/30* (2006.01)
(52) U.S. Cl. ..................... 29/841; 29/840; 174/260; 257/724
(58) Field of Classification Search ........... 29/830–832, 29/840, 841; 174/252, 258, 260, 262; 257/668, 257/686, 724, 774; 310/340; 438/126
See application file for complete search history.

(56) References Cited

U.S. PATENT DOCUMENTS 6,680,441 B2 * 1/2004 Kondo et al. ................. 174/260
6,798,121 B2 * 9/2004 Nakatani et al. ............. 310/340

FOREIGN PATENT DOCUMENTS

JP 2003-86949 3/2003

* cited by examiner

*Primary Examiner*—Donghai D. Nguyen
(74) *Attorney, Agent, or Firm*—Wenderoth, Lind & Ponack, L.L.P.

(57) ABSTRACT

The printed wiring board (PWB) includes (a) a fluid-resin embedding section formed at a location corresponding to electronic components such that the embedding section covers the electronic components, (b) a resin flow-speed accelerator placed in parallel with a top face of a circuit board and surrounding the embedding section, and (c) bonding resin placed at least between the accelerator and the circuit board. The fluid resin embedding section is filled up with the same resin as the bonding resin. This structure allows the accelerator to compress the resin with pressure applied to the PWB, so that the resin tends to flow along the circuit board. As a result, the fluid-resin embedding section is thoroughly filled up with the resin without leaving any air, and the reliable PWB is thus obtainable.

24 Claims, 20 Drawing Sheets

FIG. 24 – PRIOR ART
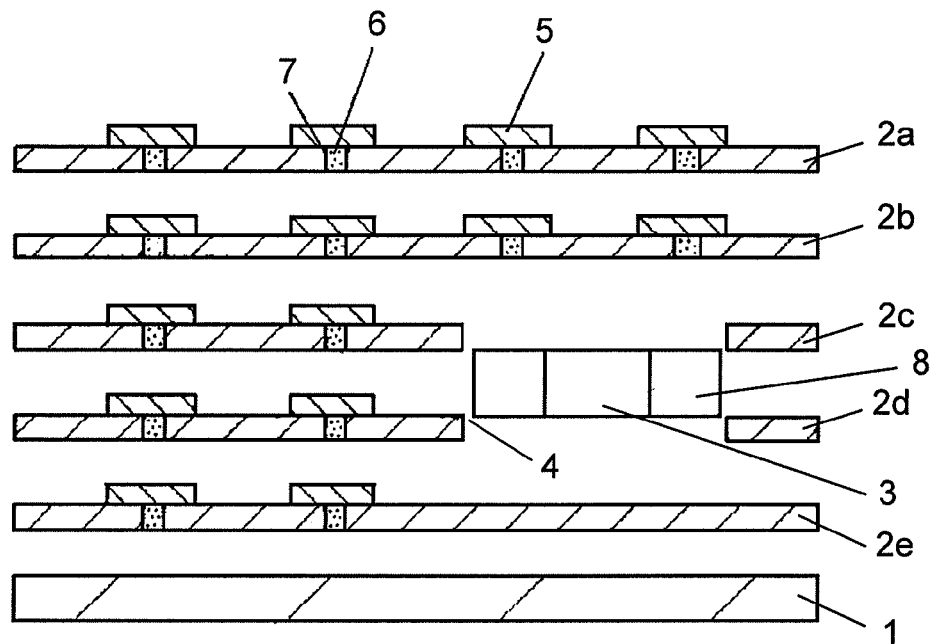
FIG. 25 – PRIOR ART
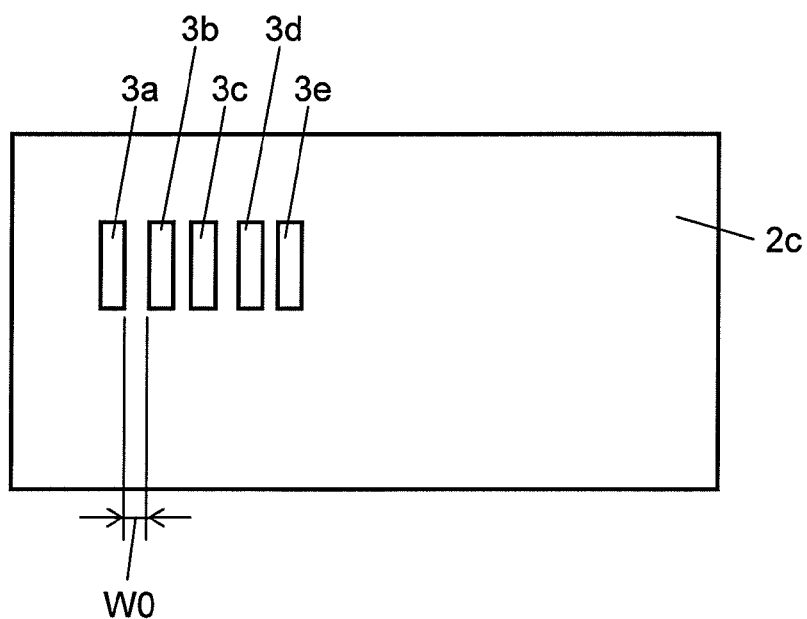

FIG. 26A – PRIOR ART
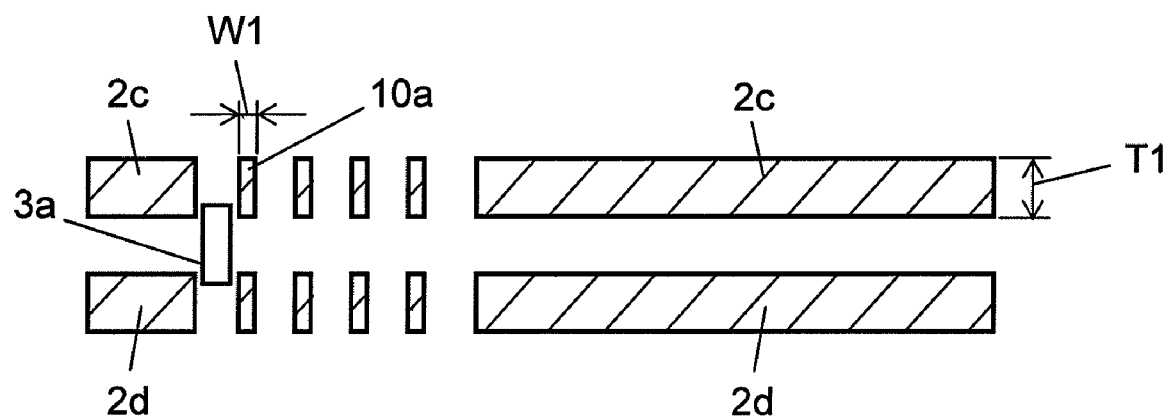
FIG. 26B – PRIOR ART
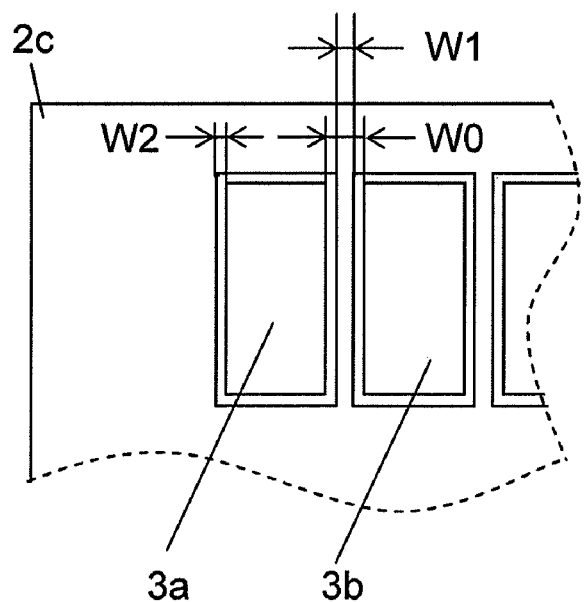

FIG. 27 – PRIOR ART
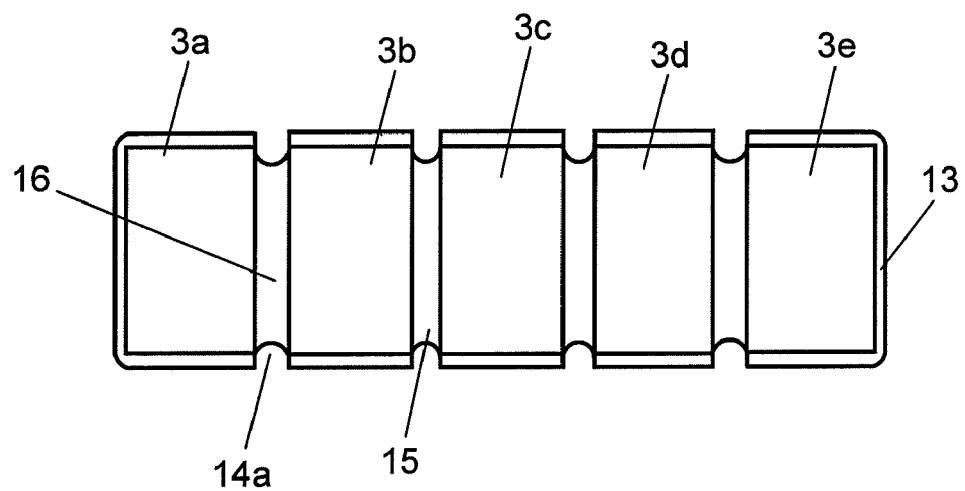
FIG. 28 – PRIOR ART
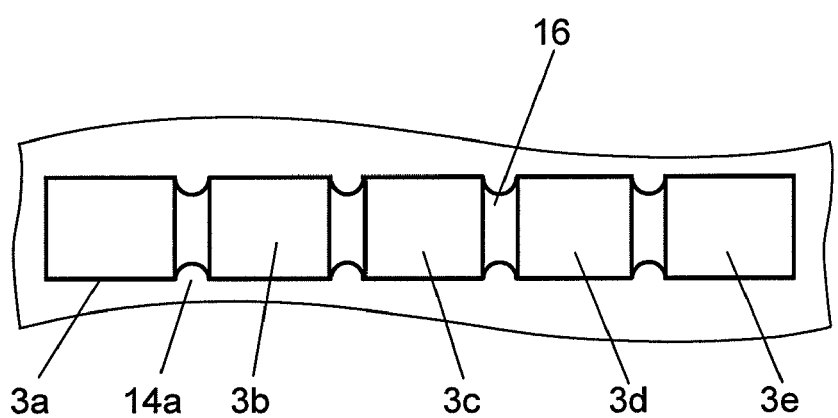

METHOD OF MANUFACTURING COMPONENT-EMBEDDED PRINTED WIRING BOARD

FIELD OF THE INVENTION

The present invention relates to a component-embedded printed wiring board which includes electronic components built therein, and a method of manufacturing the same printed wiring board.

BACKGROUND OF THE INVENTION

A conventional component-embedded printed wiring board (PWB) is described hereinafter. FIG. 24 shows a structure of the conventional PWB which includes electronic components built therein. As shown in FIG. 24, the conventional PWB comprises plate 1 made of metallic material, and substrates 2a-2e formed of thermoplastic resin and layered over metallic plate 1.

Holes 4 are opened through substrates 2c and 2d for embedding electronic component 3. Patterns 5 are provided on substrates 2a-2e, and via-holes 7 opened through substrates 2a-2e are filled with conductive paste 6. Electrodes 8 placed at both sides of component 3 are conductive to paste 6.

Conductive paste 6 is made by mixing tin grains with silver grains. Between component 3 and holes 4, clearance of 20 µm is provided surrounding component 3 for accurately positioning electrodes 8 with respect to via-holes 7 filled with paste 6. Thus it can be said that the outside dimension of component 3 is approx. equal to 20 µm.

The foregoing conventional PWB undergoes pressing and heating at 1-10 Mpa, 250-350° C. and in 10-20 minutes before completed. In other words, this pressing and heating process melts the tin to be unified with silver, and connects the tin to electrodes 8 of component 3 for fixing component 3 electrically and mechanically. The conventional component-embedded PWB is disclosed in, e.g. Japanese Patent Unexamined Publication No. 2003-86949.

The conventional PWB, however, has the following problem if components 3 are densely mounted. For instance, as shown in FIG. 25, electronic components 3a-3e are mounted at a narrow pitch to substrate 2c, and assume that an interval between the components adjacent to each other is 100 µm. FIG. 26A shows sectional views of substrates 2c and 2d, and FIG. 26B shows an enlarged view of the vicinity of components embedded. As shown in FIGS. 26A and 26B, width W1 of frame 10a placed between electronic components 3a and 3b is found by equation 1.

$$W1 = W0 - W2 \times 2 \quad (1)$$

where W2 is, e.g. a distance between component 3a and substrate 2c surrounding component 3a. In this case, since W0=100 µm and W2=20 µm, W1 becomes 60 µm, i.e. the width of frame 10a is 60 µm.

Thickness T1 of substrate 2c is 75 µm, so that width W2 of frame 10a becomes smaller than thickness T1 of substrate 2c, and it becomes physically difficult to manufacture this conventional PWB.

To overcome this problem, holes 13 surrounding components 3a-3e mounted at narrow pitches can be provided as shown in FIG. 27 (plan view) and FIG. 28 (sectional view). In this case, however, space 14a between components 3a and 3b cannot be filled sufficiently with resin 15, so that air 16 sometimes remains. If substrate 2c in this status undergoes soldering in a reflow-oven, the reflow-temperature expands air 16 for applying heavy load between components 3a and 3b. The load has the possibility of damaging the connection of component 3, to be more specific, the conduction of paste 6 is cut, or component 3 sealed with resin produces cracks into which water leaks for rusting electrodes 8 and causing defective insulation.

SUMMARY OF THE INVENTION

A component-embedded printed wiring board (PWB) of the present invention comprises the following elements:
  a fluid resin embedding section formed at a place corresponding to electronic components embedded such that it covers the electronic components;
  a resin flow-speed accelerator disposed in parallel with a top face of a circuit board such that it surrounds the fluid resin embedding section; and
  bonding resin disposed between the resin flow-speed accelerator and the circuit board.

The fluid resin embedding section is filled up with the same resin as the bonding resin. This structure enables the provision of a component-embedded PWB of high connection reliability.

BRIEF DESCRIPTION OF THE DRAWINGS

FIG. 24 shows an exploded sectional view of a conventional component-embedded PWB.

FIG. 25 shows a plan sectional view taken from over the conventional component-embedded PWB.

FIG. 26A shows a sectional view of an essential part of the conventional component-embedded PWB.

FIG. 26B shows an enlarged top view of vicinity of components embedded in the conventional PWB.

FIG. 27 shows a plan view of an essential part of the conventional component-embedded PWB.

FIG. 28 shows a sectional view of an essential part of the conventional component-embedded PWB.

DETAILED DESCRIPTION OF THE INVENTION

Embodiment 1

Figure 1:
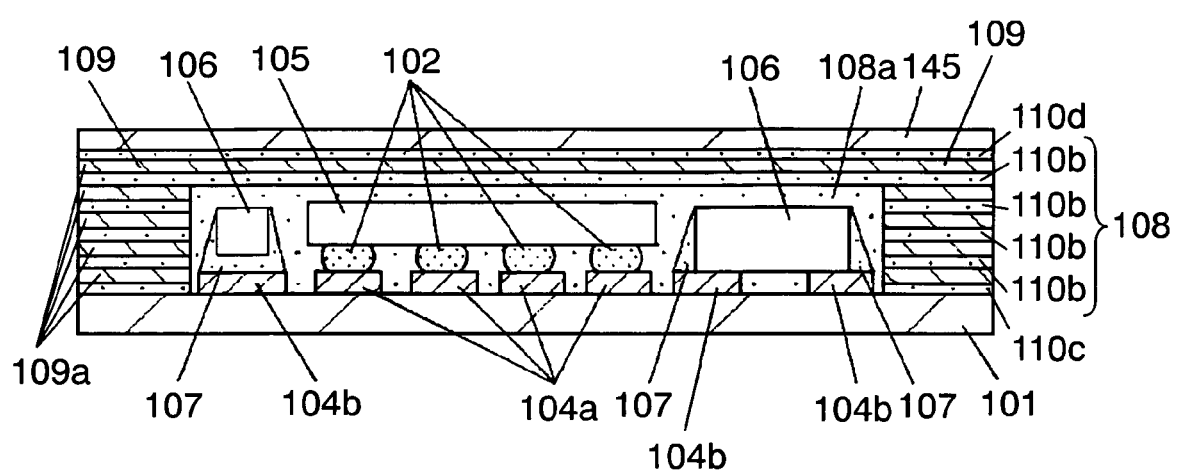
FIG. 1 shows a sectional view of a component-embedded printed wiring board (PWB) in accordance with a first embodiment of the present invention.
Figure 2:
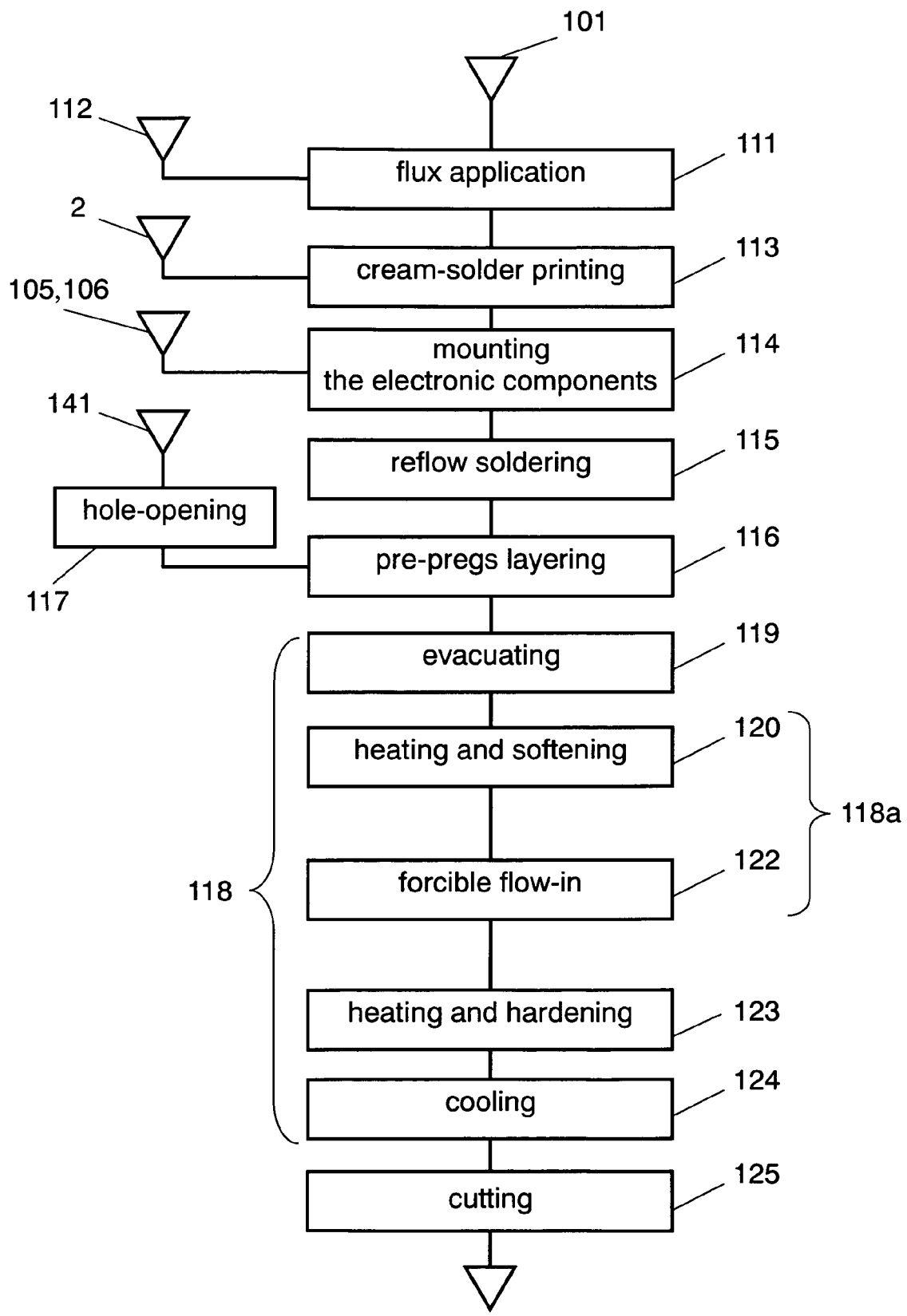
FIG. 2 shows a flowchart illustrating steps of manufacturing the component-embedded PWB in accordance with the first embodiment.

The first exemplary embodiment of the present invention is demonstrated hereinafter with reference to FIG. 1-FIG. 12. FIG. 1 shows a sectional view of a component-embedded printed wiring board (PWB) in accordance with the first embodiment of the present invention. FIG. 2 shows a flowchart illustrating the steps of manufacturing the component-embedded PWB. FIG. 3-FIG. 12 detail respective manufacturing steps of the component-embedded PWB in accordance with the first embodiment. In these drawings, similar elements to those of the prior art have the same reference marks, and the descriptions thereof are simplified.

The construction of the component-embedded PWB in accordance with the first embodiment is described with reference to FIG. 1. Circuit board 101 shown in FIG. 1 is formed of thermosetting resin in a multi-layer structure. Board 101 has inner via-holes (not shown) which connect respective top faces to respective undersides of each layer. The respective top faces have copper foils thereon, and the foils form electric circuits respectively. Copper foil 145 is an example of conductive patterns which can employ printed wiring patterns formed of metallic powder paste.

The top face of circuit board 101 has land patterns 104a and 104b thereon. Semiconductor element 105 mounted on the top face of board 101 is coupled to land pattern 104a with solder bump 102. Resistor 106 is coupled to land pattern 104b with solder 107. These components are used as examples of electronic components; other electronic components such as capacitors can be embedded.

Solder 107 and bump 102 employ lead-free solder, namely, solder made of tin-, silver-, or copper-based metal, because these materials do not contain harmful substances and their environment load is low. Instead of solder 107 or bump 102, conductive adhesive having a thermosetting property can be used. This adhesive has a melting point higher than the solder, so that semiconductor element 105 or resistor 106 never comes off from circuit board 101 even in a high temperature environment such that soldering is carried out near these components.

Component embedding layer 108 is sandwiched by circuit board 101 and copper foil 145, and is filled with thermosetting resin. Layer 108 tightly seals semiconductor element 105 and resistor 106 at their peripheries. Layer 108 includes fluid-resin embedding section 108a made of resin and covering both of semiconductor element 105 and resistor 106, and substrate-included resin section 109 covering the periphery of fluid-resin embedding section 108a. Substrate-included resin section 109 is formed by layering plural substrates 109a, plural resins 110b and 110c alternately. In this first embodiment, plural substrates 109a are used as an example of a resin flow-speed accelerator shaping like a board, and plural resins 110b and 110c are used as an example of bonding resin.

Resin 110c is placed between the lower most substrate 109a and circuit board 101, and resin 110d is placed between upper most substrate 109a and copper foil 145. Substrate 109a of this embodiment has a thickness of approx. 80 μm, resin 110b has a thickness of approx. 10 μm, resin 110c and resin 110d have a thickness of approx. 5 μm.

The foregoing structure, i.e. layering substrates 109a one after another, allows substrate 109a to accelerate a flow speed of resins 110 layered on circuit board 101 along the surface of board 101 in a unifying step described later, so that the fluid-resin embedding section has every nook and cranny filled with the resin. As a result, no air remains. This structure, therefore, allows the load produced by thermal expansion of the air not to damage the connections, and improves the connection reliability. Resin 110 is a collective term which includes resins 110b-110d, and thermosetting resin such as epoxy resin is suitable for resin 110.

Fluid-resin embedding section 108a is formed of thermosetting epoxy resin as is resin 110. Since embedding section 108a and resin 110 are made of the same resin, they have the same thermal expansion coefficient with respect to temperatures, so that a thermal change expands or contracts these two elements in the same amount. As a result, damage or breakage rarely occur in the boundary between embedding section 108a and resin 110.

Since resin 110c is disposed between substrate 109a and circuit board 101, peel-off rarely occurs between component embedding layer 108 and circuit board 101. On top of that, since resin 110d is disposed between substrate 109a and copper foil 145, peel-off rarely occurs between component embedding layer 108 and copper foil 145.

Substrate 109a employs glass woven fabric, which prevents embedding section 108a from being easily bent. Because if embedding section 108a is formed of only epoxy resin, its flexural strength is weakened. As a result, smaller expansion and contraction due to thermal changes can be expected.

In this embodiment, glass woven fabric is used as substrate 109a; however, glass non-woven fabric or woven or non-woven fabric of other fibers such as aramid fiber can be used instead. Epoxy resin is used as fluid-resin embedding section 108a and resin 110; however, other thermoplastic resin or thermosetting resin such as unsaturated polyester resin can be used instead with an advantage similar to the one obtained in this embodiment.

Respective steps of a method of manufacturing the component-embedded PWB in accordance with the first embodiment are demonstrated hereinafter with reference to FIG. 3-FIG. 16 following the sequence of the steps shown in FIG. 2.

Figure 3:
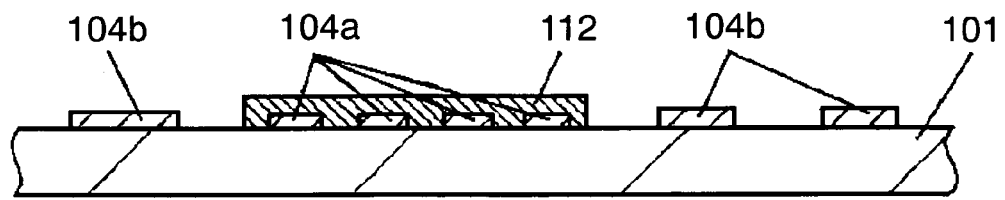
FIG. 3 shows a sectional view of the component-embedded PWB in the step of flux application in accordance with the first embodiment.

FIG. 2 shows a flowchart of manufacturing the component-embedded PWB in accordance with the first embodiment, and FIG. 3 shows a sectional view of the PWB in flux application step 111. In step 111, flux 112 is printed on land pattern 104a, to which semiconductor element 105 (shown in FIG. 5) is to be mounted, through a metal screen (not shown).

Figure 4:
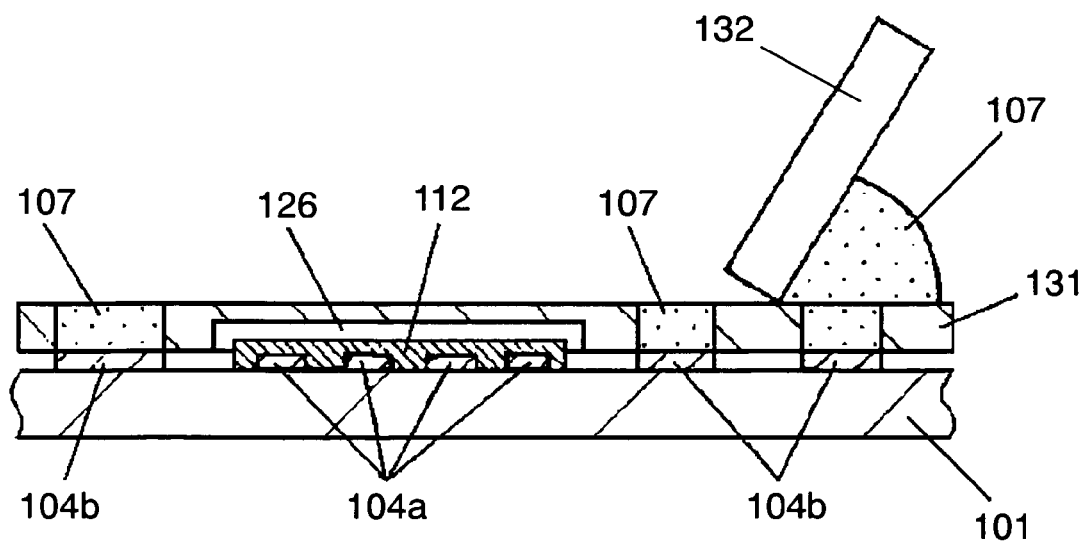
FIG. 4 shows a sectional view of the component-embedded PWB in the step of cream-solder printing in accordance with the first embodiment.

FIG. 4 shows a sectional view of the component-embedded PWB in step 113 of printing cream solder in accordance with the first embodiment. As shown in FIG. 2, cream-solder printing step 113 follows flux application step 111. In step 113, cream solder 107 is printed on land pattern 104b, to which resistor 106 (shown in FIG. 5) is to be mounted, with squeegee 132 and screen 131. Cream solder 107 is used as an example of coupling and fixing member for connection. Screen 131 is a metal screen made of stainless steel, and recess 126 is formed on screen 131 at a place corresponding to flux 112 applied. Recess 126 prevents flux 112 from adhering to screen 131 during the printing of solder 107.

Figure 5:
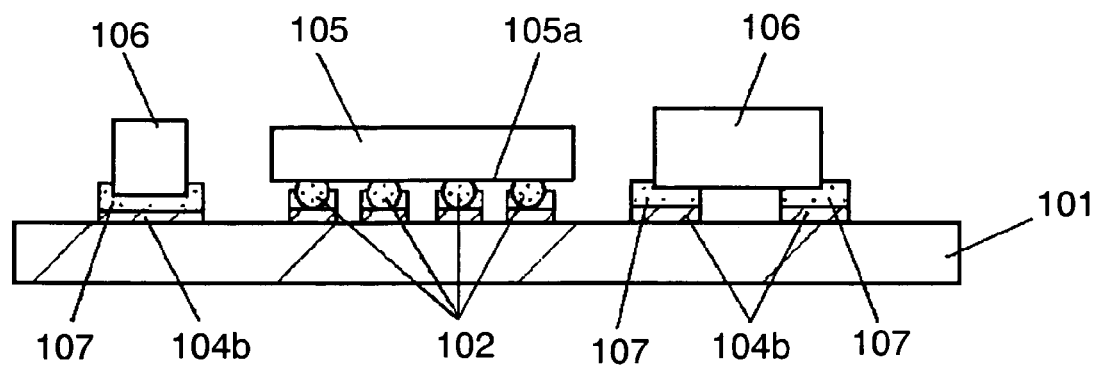
FIG. 5 shows a sectional view of the component-embedded PWB in the step of mounting electronic components in accordance with the first embodiment.

FIG. 5 shows a sectional view of the component-embedded PWB in step 114 of mounting electronic components in accordance with the first embodiment. As shown in FIG. 2, step 114 of mounting the electronic components follows step 113 of printing the cream solder. In step 114, semiconductor element 105 and resistor 106 are mounted onto circuit board 101 at given places by an automatic insertion machine. A plurality of solder bumps 102 are formed in advance on underside 105a of semiconductor element 105.

Figure 6:
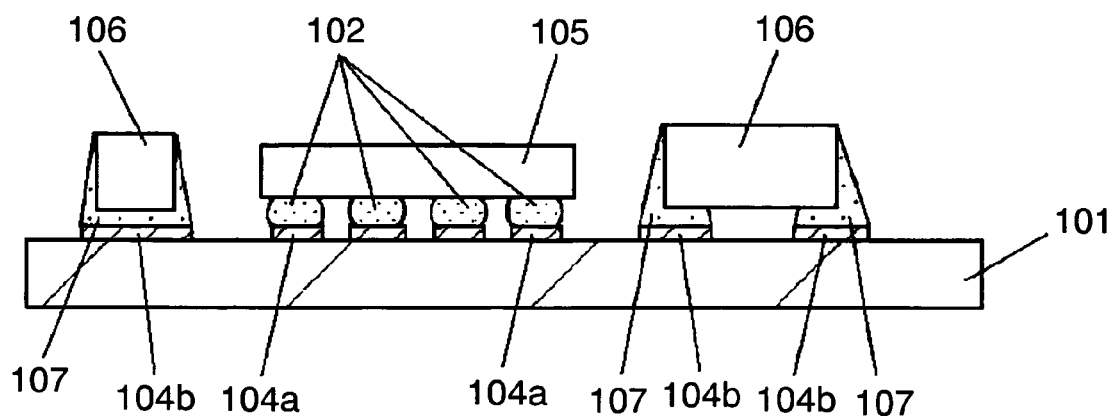
FIG. 6 shows a sectional view of the component-embedded PWB in a reflow soldering step in accordance with the first embodiment.

FIG. 6 shows a sectional view of the component-embedded PWB in reflow soldering step 115 in accordance with the first embodiment. As shown in FIG. 2, reflow soldering step 115 follows step 114 of mounting the electronic components. In step 115, cream solder 107 is heated to a temperature higher than its melting point, so that cream solder 107 is melted, whereby resistor 106 is soldered to land pattern 104b, and bumps 102 of semiconductor element 105 are soldered to land pattern 104a. In this embodiment, reflow soldering step 115 is carried out in nitrogen atmosphere, thereby preventing the surface of circuit board 101 from being oxidized. The contact between board 101 and pre-preg 141a (shown in FIG. 7) is thus improved.

After reflow soldering step 115, in-process items can be washed in a step (not shown) of washing circuit board 101, so that residue of flux 112 and solder balls are cleaned. On top of that, $O_2$ asher process and silane coupling process are recommended, because these surface modifying processes improve the contact between board 101 and pre-preg 141a.

In this embodiment, the reflow soldering is used because of its excellent quality. The reflow soldering allows fixing of the components soldered at given places due to its self-alignment effect, so that components can be accurately fixed to board 101 and the length of pattern-lines connected to these components becomes a definite value. In other words, when the pattern lines are used as an inductor, the inductance can produce a definitive value, so that a given electrical performance can be expected. This is an important matter for a high-frequency circuit.

Figure 7:
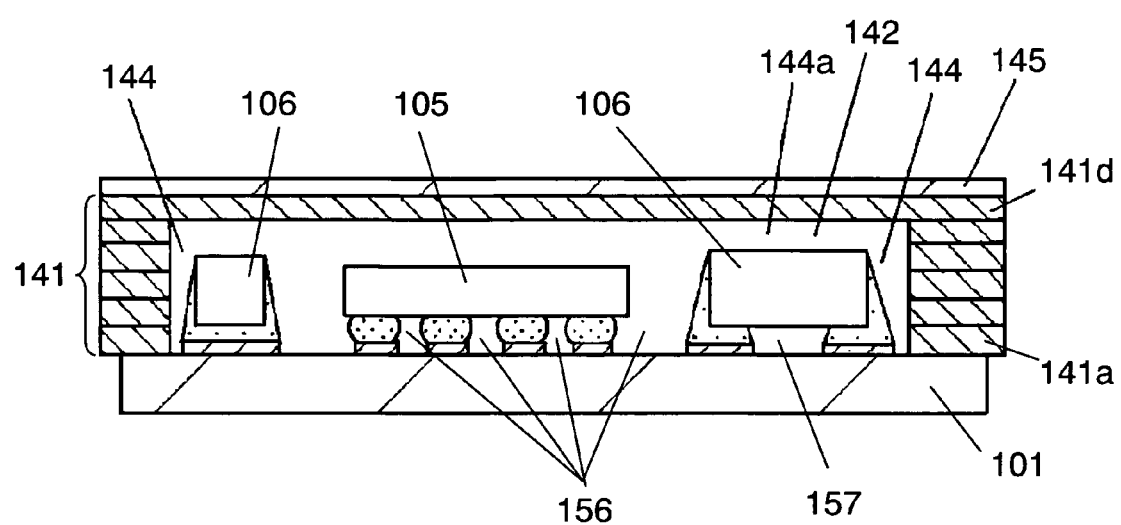
FIG. 7 shows a sectional view of the component-embedded PWB in the step of layering pre-pregs in accordance with the first embodiment.
Figure 8:
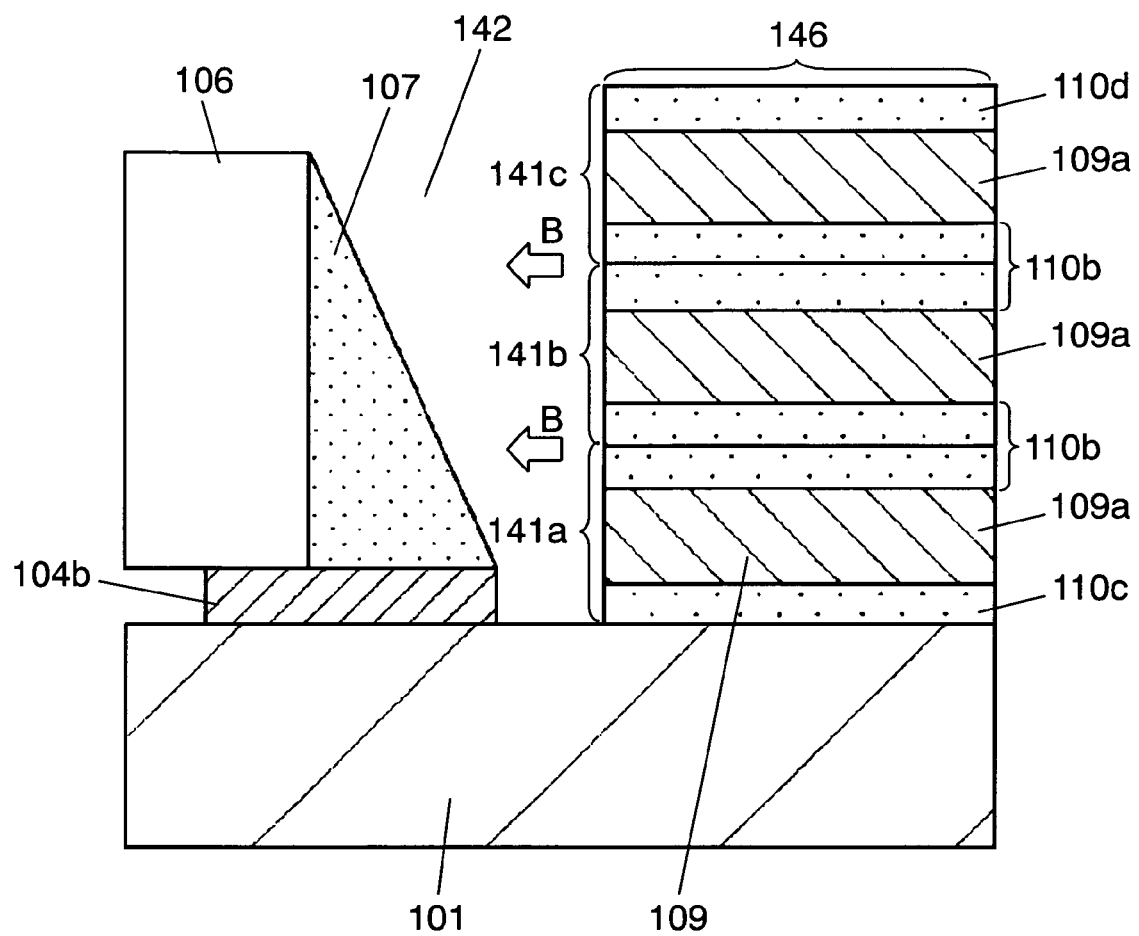
FIG. 8 shows an enlarged view of an essential part of the component-embedded PWB in the step of layering pre-pregs in accordance with the first embodiment.

FIG. 7 shows a sectional view of the component-embedded PWB in step 116 of layering pre-pregs in accordance with the first embodiment, and FIG. 8 shows an enlarged view of an essential part of the foregoing component-embedded PWB. As shown in FIG. 2, in hole-opening step 117, hole 142 is opened on pre-preg 141 for receiving semiconductor element 105 and resistor 106 therein. In pre-pregs layering step 116 following reflow soldering step 115, pre-preg 141 with the hole is layered on circuit board 101. Pre-preg 141 is a collective term which includes individual pre-pregs 141a, 141b, and 141c. For instance, pre-preg 141a includes resin 110c, substrate 109a and resin 110b. Pre-preg 141b includes resin 110b, substrate 109a and resin 110b. Pre-preg 141c includes resin 110b, substrate 109a and resin 110d. Pre-preg 141 employs substrate 109a made of non-woven fabric and impregnated with epoxy resin 110c in advance to be unified. Substrate 109a is used as an example of the resin flow-speed accelerator.

As shown in FIG. 8, pre-preg 141 is layered on circuit board 101, so that a layered unit, where substrate 109a, resins 110b, 110c and 110d are layered one after another, is completed on circuit board 101. Pre-preg 141 has a thickness of approx. 120 μm because substrate 109a has a thickness of approx. 80 μm and is impregnated with resin 110, thereby increasing the thickness to approx. 120 μm.

Clearances 144 are reserved between the outer walls of resistor 106 and inner wall of hole 142, so that pre-preg 141 with the hole can be layered on circuit board 101 with ease.

Since semiconductor element 105 and resistor 106 are mounted on board 101 by reflow-soldering, the self-alignment effect due to melting of cream solder 107 allows mounting of these elements at given places accurately. In other words, clearances 144 can be reduced in size because semiconductor element 105 and resistor 106 are mounted precisely, which allows resin 110 to flow into spaces 156, 157 with ease. In this embodiment, clearances 144 take the maximum value of approx. 0.2 mm, so that even if resistor 106 is mounted deviating from a predetermined place, pre-preg 141 can be layered free from inconveniences such as collision.

Individual pre-pregs 141, which are impregnated with resin 110b, 110c and 110d respectively in advance, are used with respect to substrate 109a. Thus hole 142 can be opened simultaneously through substrate 109a and resin 110b, so that excellent productivity can be expected. There is no need to layer substrate 109a and resin 110 individually, so that the number of layering processes can be reduced, which also improving the productivity.

On the upper most face of pre-preg 141, pre-preg 141d having no hole 142 is placed, and copper foil 145 is provided on the entire top face of pre-preg 141d. In layering step 116, resin 110c of approx. 20 μm thickness, substrate 109a of approx. 80 μm, and resin 110b of 40 μm thickness are layered in this order from the bottom on circuit board 101. Between the uppermost substrate 109a and copper foil 145, resin 110d of approx. 20 μm thickness is layered.

Pre-preg 141d and copper foil 145 are used in this embodiment; however, a hardened circuit board can be used instead. Any hardened circuit-board such as a single-sided board, double-sided board, or multi-layer board can be used. Use of the hardened circuit board can reduce a warp of pre-preg 141 caused by thermal contraction in a cooling step described later.

Since there is a small space between semiconductor 105 and resistors 106, only one hole 142 that accommodates all of a plurality of electronic components is provided. When there are enough spaces between respective electronic components, plural holes can be prepared for accommodating each one of the components respectively. In this case, however, clearances should be provided between the hole and the respective components so that pre-preg 141 can be mounted. A depth of each hole can be changed in response to a height of the respective components. These preparations reduce a cubic volume to which the resin is to be embedded, so that the resin can reach every nook and cranny.

In unifying step 118, circuit board 101 layered in step 116, pre-preg 141 and copper foil 145 undergo heating and pressing at a temperature slightly lower than the melting point of solder 107, so that they are unified together. Step 118 is described hereinafter following the sequence of the steps shown in FIG. 2.

Figure 9:
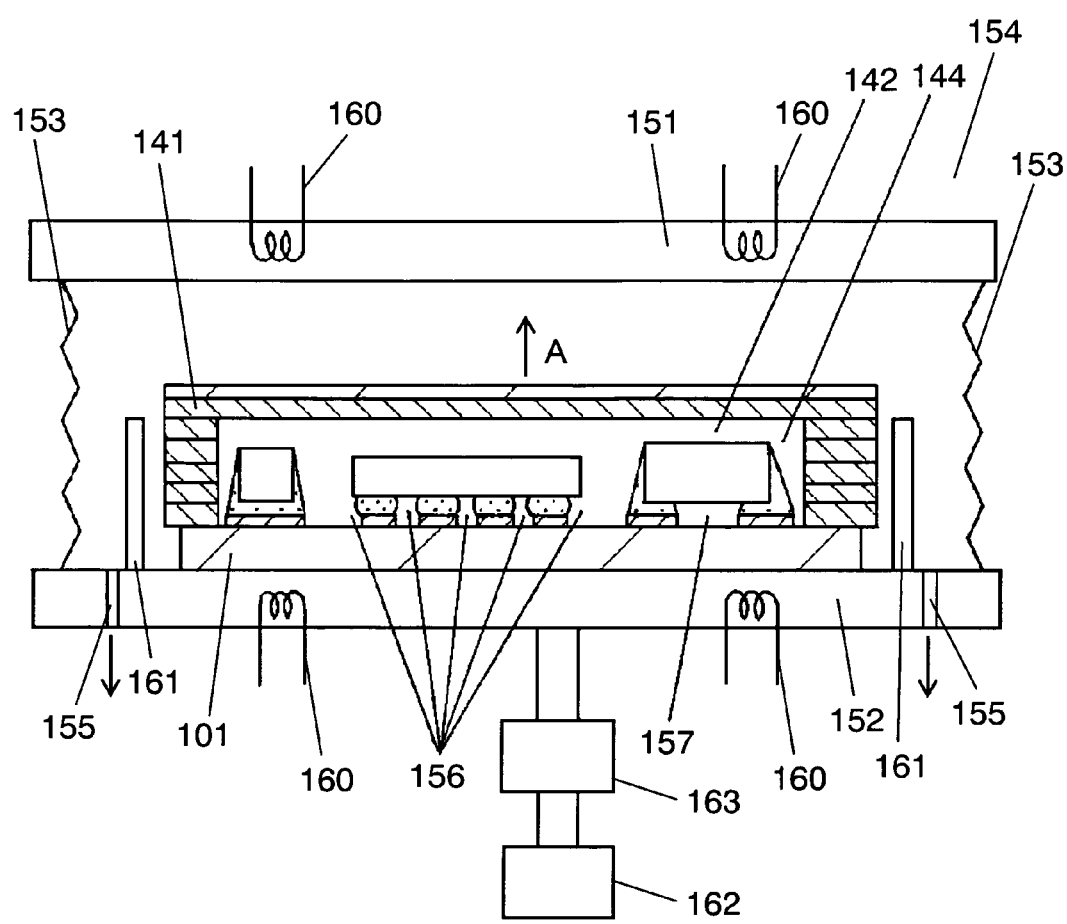
FIG. 9 shows a sectional view of the component-embedded PWB in a unifying step in accordance with the first embodiment.

FIG. 9 shows a sectional view of a unifying device used in the unifying step in accordance with the first embodiment. The unifying device includes platens 151 and 152, and circuit board 101 is mounted on platen 152. Platens 151, 152, and expandable walls 153 on both sides form air-tight container 154. A sucking device (not shown) is coupled to airtight container 154. Heaters 160 are embedded in platens 151, 152 for heating pre-preg 141.

Between driver 162 and platen 152, speed reducer 163 is placed. Speed reducer 163 converts rotary motion into reciprocating motion, and also reduces the rotating speed. A control circuit (not shown) is coupled to driver 162 and heater 160, and controls the timing that operates these two elements. Since resin 110 changes in viscosity in response to temperatures, the temperature of heater 160 is controlled in order to obtain a given viscosity of resin 110.

Figure 10:
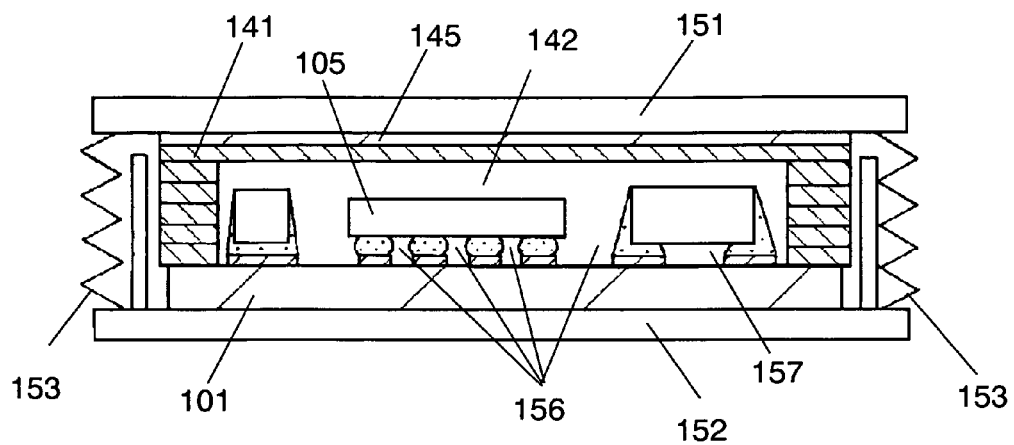
FIG. 10 shows a sectional view of the component-embedded PWB in an evacuating step in accordance with the first embodiment.

Unifying step 118 using the foregoing unifying device is detailed hereinafter. FIG. 10 shows a schematic sectional view of the unifying device employed in an evacuating step in accordance with the first embodiment. As shown in FIG. 2, the first step in unifying step 118 is evacuating step 119 which follows pre-preg layering step 116. In evacuating step 119, the component-embedded PWB of which pre-preg 141 is layered on circuit board 101 is housed in air-tight container 154. Platen 151 is fixed and platen 152 is movable.

A sucking device sucks the air in airtight container 154 through vent hole 155 opened through platen 152, so that airtight container 154 is decompressed to a substantially vacuum condition. At this time, it is important to decompress the inside of hole 142 to a substantially vacuum condition, which allows resin 110 in pre-preg 141 to be charged into hole 142, spaces 156 between circuit board 101 and semiconductor 105, and space 157 between circuit board 101 and resistor 106 in every nook and cranny in forcible flow-in step 122 described later. The width of space 156 ranges from approx. 20 µm to approx. 350 µm, and the width of space 157 ranges from approx. 10 µm to approx. 40 µm.

In order to simplify the description, one semiconductor element 105 and two resistors 106 are used as examples of electronic components in this embodiment; however, more electronic components are actually mounted on circuit board 101. Considering the productivity of the component-embedded PWB, a greater size of circuit board 101 is preferable, and therefore, more clearances 144 and spaces 156, 157 exist practically.

In evacuating step 119, it is thus important to completely suck the air existing in these numerous clearances 144 and spaces 156 and 157, because if the airs remain in pre-preg 141, voids tend to occur. To overcome this problem, the following preparations are carried out: In layering step 116, board-like pre-pregs 141 having no viscosity at a room temperature, i.e. solid pre-preg, are layered one after another in order to resist the occurrence of voids. Then in evacuating step 119, hole 142 is evacuated before pre-preg 141 is softened. These preparations allow the air in hole 142 to be sucked therefrom before pre-preg 141 becomes liquid and has viscosity, in which status, pre-pregs 141 adhere to each other, or pre-preg 141 adheres to circuit board 101. Evacuating step 119 is preferably completed at the latest before the temperature of pre-preg 141 rises to the glass transition point, so that the air in the spaces between respective pre-pregs 141 and the space between pre-preg 141 and circuit board 101 can be sucked completely therefrom. As a result, clearances 144 and spaces 156 and 157 can be evacuated positively, thereby inhibiting the occurrence of voids.

In this embodiment, heaters 160 start working to heat platens 151, 152 simultaneously with the start of evacuating step 119, and driver 162 starts driving platens 152, so that a given pressure is applied to the component-embedded PWB. This preparation shrinks expandable walls 153, so that platen 152 is raised along arrow mark A as shown in FIG. 9. Then as shown in FIG. 10, circuit board 101, layered pre-preg 141 and copper foil 145 are compressed completely between platens 151 and 152 by a predetermined pressure. Heaters 160 work at approx. 110° C., and a pressure of approx. 40 kg/cm² is used.

Figure 11:
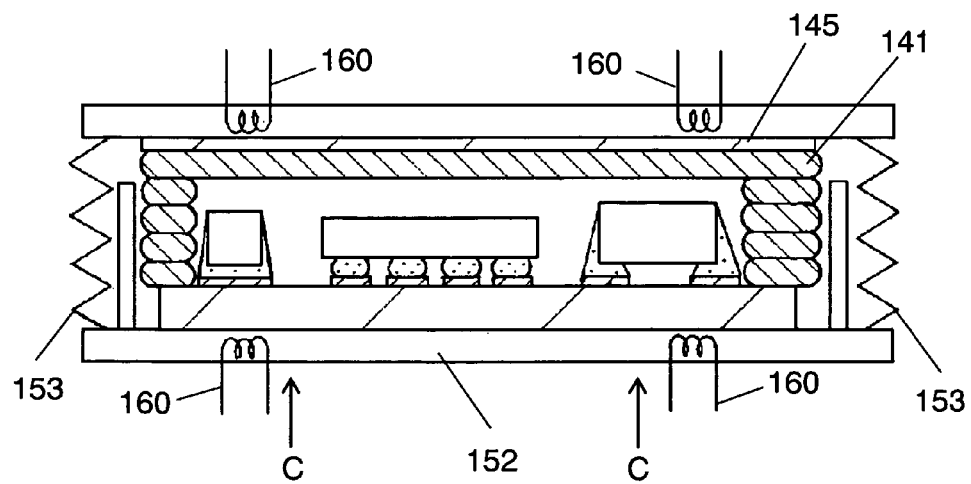
FIG. 11 shows a sectional view of the component-embedded PWB in the step of heating and softening in accordance with the first embodiment.

FIG. 11 shows a sectional view of the unifying device used in a softening step in accordance with the first embodiment. As shown in FIG. 2, evacuating step 119 is followed by heating and softening step 120. Pre-preg 141 starts to be heated when platens 151 and 152 are brought into contact with circuit board 101 and copper foil 145 through evacuating step 119. Resin 110 impregnated into pre-preg 141 is softened by the heat from heater 160. Resin 110 is heated up to approx. 110° C., and its viscosity is lowered to approx. 2400 pa·s.

Pre-preg 141 is compressed by platens 151, 152, which thus solidly contact the surface of copper foil 145. The heat from heater 160 can thus be positively transferred to pre-preg 141, so that a heating device excellent in energy efficiency and in saving energy is obtainable.

Figure 12:
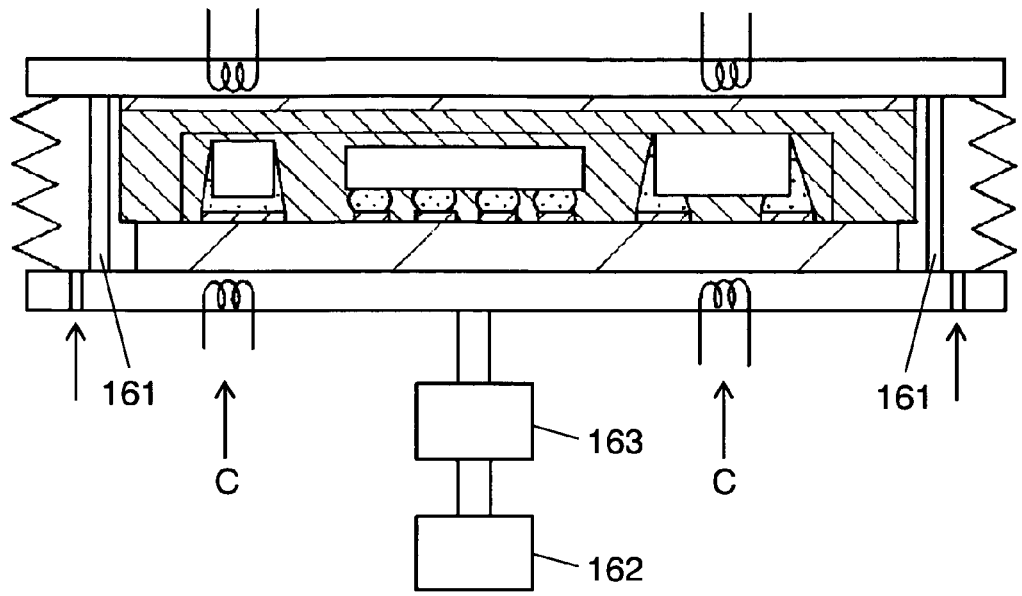
FIG. 12 shows a sectional view of the component-embedded PWB in a forcible flow-in step in accordance with the first embodiment.

FIG. 12 shows a sectional view of the unifying device in the forcible flow-in step in accordance with the first embodiment. As shown in FIG. 2, heating and softening step 120 is followed by forcible flow-in step 122, in which respective pre-pregs 141 are compressed into the thickness of approx. 90 µm. At this time, resins 110b, 110c, 110d of pre-pregs 141 flow along substrate 109a in the direction of arrow mark B (shown in FIG. 8), and flows into hole 142. Eventually clearances 144, spaces 156 and 157 are entirely filled with the resin flowing out from resins 110b, 110c, and 110d, which are named sometimes collectively as resin 110.

In order to increase the flow-speed of resin 110, the viscosity of resin 110 is preferably kept at a low level for the longest possible period. For this purpose, it is important to give resin 110 a viscosity which turns resin 110 fluid as quick as possible. In heating and softening step 120, the temperature of pre-preg 141 is thus raised at a rate of 4.5° C./minute. On top of that, in forcible flow-in step 122, pre-preg 141 is kept at 110° C. for 30 minutes and is compressed by the pressure of 40 kg/cm².

These preparations lower the viscosity of pre-preg 141 quickly to a low enough level for the resin to start flowing in 15 minutes after the heating starts. In 25 minutes after the heating starts, the viscosity becomes the lowest level, i.e. approx. 1500 pa·s. The temperature of 110° C. is maintained for 50 minutes after the heating starts. As discussed above, the lowest viscosity is preferably maintained as long as possible, and for this purpose, the viscosity of resin 110 is lowered as quick as possible, so that clearances 144, spaces 156 and 157 start to be filled with the resin as early as possible. At the same time, the temperature of 110° C. is maintained for a given period in order to delay as long as possible the progress of thermosetting reaction. As a result, the viscosity is prevented from rising due to the progress of reaction of thermosetting resin.

Since platens 151 and 152 sandwich circuit board 101 and pre-preg 141 in the vertical direction before they are heated in heating and softening step 120, circuit board 101 and pre-preg 141 are heated unevenly depending on the locations of heaters 160 embedded in platens 151, 152. Temperature differences thus tend to occur on board 101 and pre-preg 141 due to this uneven heat. In general, spaces 156, 157 are formed away from platens 151, 152. Spaces 156, 157 eventually have some points of which temperatures are lower than the temperature of resin 110. If resin 110 flows into spaces 156, 157 before resin 110 and spaces 156, 157 have a uniform temperature, the temperature of resin 110a, namely a tip of the resin flow, lowers. As a result, resin 110a flowing into spaces 156, 157 is caused to have a high viscosity, and resin 110a does not move halfway of the spaces in forcible flow-in step 122. This problem invites insufficient fill-up of the resin into the spaces, so that voids tend to occur.

The first embodiment thus keeps the temperature of 110° C. for approx. 30 minutes in forcible flow-in step 122, so that the temperatures of spaces 156, 157 and resin 110 become uniform, thereby preventing resin 110 from stopping its flow into the spaces caused by the temperature decrease. The movement of platen 152 is stopped by stopper 161.

After spaces 156, 157 are filled up with resin 110, heating and hardening step 123 hardens resin 110. In step 123, pre-preg 141 is heated to a temperature lower than a liquidus temperature of solder bump 102 and solder 107, so that pre-preg 141 loses its fluidity and is completely hardened. In the meantime, at the liquidus temperature, solder becomes liquid completely by heating.

In heating and hardening step 123, it is important to heat pre-preg 141 so that it becomes hardened and loses its fluidity at a temperature lower than the liquidus temperature of solder bump 102 and solder 107. Solder bump 102 and solder 107 employ lead-free solder that has a melting point of approx. 270° C., so that the temperature at which resin 110 loses its fluidity is preferably set not higher than 200° C. in step 123. In this embodiment, step 123 employs a pressure of 40 kg/cm$^2$ so that resin 110 can lose its fluidity at approx. 150° C. The viscosity of resin 110 at this time is approx. 24000 pa·s.

As discussed above, heating and hardening step 123 makes resin 110 lose its fluidity completely, and then raises the temperature of resin 110 to 200° C. for hardening resin 110. Since resin 110 loses its fluidity at approx. 150° C. in step 123, connection between semiconductor 105 and circuit board 101, or connection between resistors 106 and board 101 never comes off.

After pre-preg 141 is hardened, the step moves on to cooling step 124, where moderate cooling is slowly carried out. The component-embedded PWB sandwiched by platen 151 and platen 152 is slowly cooled by controlling the temperature of heaters 160. This cooling is done until the temperature reaches not higher than the glass transition point (160° C. by TMA measuring method). Then water is poured into platens 151, 152 for quickly cooling by the water. These preparations allow for a decrease in the difference in shrinkage amount between copper foil 145 and resin 110 caused by different coefficients of linear expansion of these two elements. As a result, warping of the component-embedded PWB can be reduced, and conductors on board 101 are prevented from peeling off from resin 110 at their interface.

Figure 13:
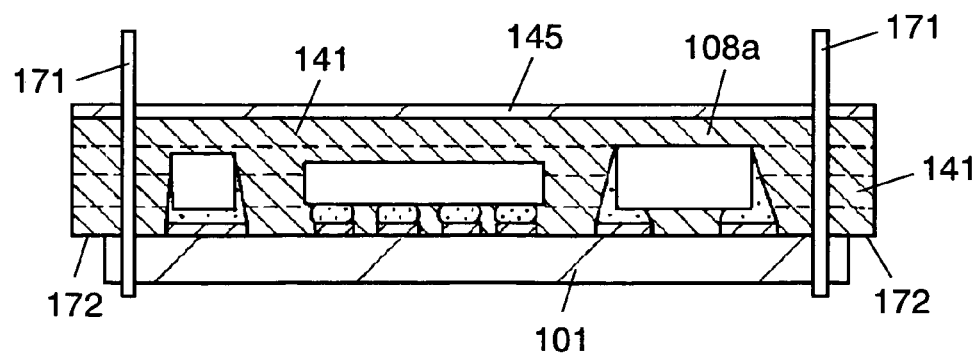
FIG. 13 shows a sectional view of the component-embedded PWB in the step of cutting in accordance with the first embodiment.

FIG. 13 shows a sectional view of a cutting device in cutting step 125 in accordance with the first embodiment. Cutting step 125 cuts resin 172 flowing out to the outside of circuit board 101 through forcible flow-in step 122. In step 125, the component-embedded PWB is cut by rotating dicing teeth 171, which cuts not only surplus resin 172 but also both of circuit board 101 and resin 172. Because circuit board 101 is cut inside the edge, the size of the component-embedded PWB becomes approx. a definite size regardless of expansion or contraction of circuit board 101.

As discussed above, in unifying step 118, heating and softening step 120 sharply heats the resin to be fluid, and heating and compressing step 118a suppresses a temperature rise applied to pre-preg 141 as well as circuit board 101 and maintains the temperature. Step 118a compresses pre-preg 141 at the temperature maintained so that circuit board 101 is unified with pre-preg 141 for completing component embedding layer 108. Meanwhile, step 118a includes heating and softening step 120 and forcible flow-in step 122.

In unifying step 118, resin 110 flows into spaces 156 and 157. This movement is detailed hereinafter. First, the relation between a temperature, pressure and viscosity of resin 110 is described with reference to FIG. 14.

Figure 14:
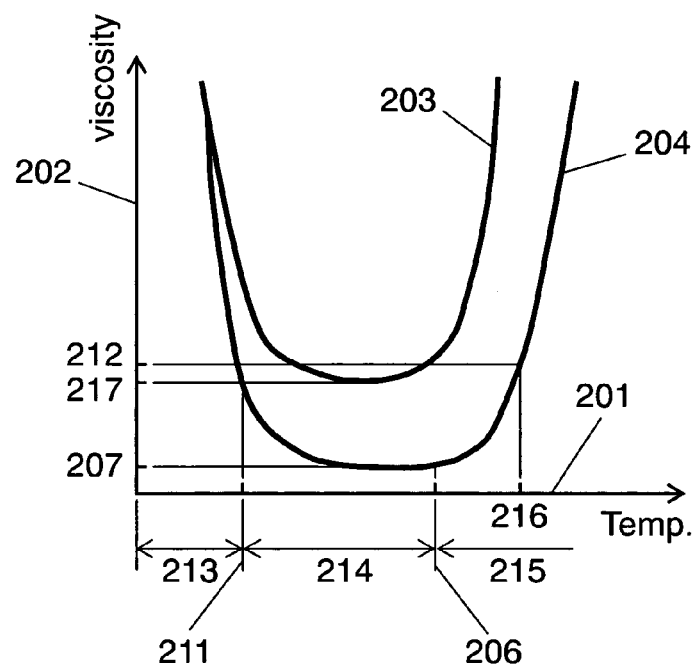
FIG. 14 shows viscosity characteristics of epoxy resin in accordance with the first embodiment.

FIG. 14 shows viscosity characteristics of resin 110 measured by a viscosity tester. Lateral axis 201 represents temperatures, vertical axis 202 represents viscosity. In FIG. 14, curve 203 shows the viscosity on the assumption that the temperature rises at a given rate both in steps 120 and 122. Curve 204 shows viscosity characteristics on the assumption that the temperature rises more moderately in forcible flow-in step 122 than in heating and softening step 120.

In the case of curve 203, i.e. in the case where the temperature rises at a given rate both in steps 120 and 122, a temperature rising speed becomes slower, so that the viscosity lowers by a smaller amount. Minimum viscosity 217 thus eventually becomes greater. As a result, in forcible flow-in step 122, resin 110 becomes resistant to flow into spaces 156, 157.

On the other hand, in the case of curve 204, i.e. in step 122 the temperature rises more slowly or steadily, and in step 120 the temperature rising speed becomes faster proportionately, the viscosity lowers by a greater amount, and the minimum viscosity becomes smaller.

In the case of curve 204, resin 110 is not viscous at room temperature, and it becomes softer and lowers its viscosity as the temperature rises. At temperature 206, the viscosity reaches minimum viscosity 207, and it increases as the temperature rises from temperature 206, so that the hardening of resin 110 is quickened. When temperature 206 is approx. 133° C., minimum viscosity 207 of resin 110 becomes approx. 1150 pa·s.

The fluidity of resin 110 is determined by a pressure applied to resin 110 and a viscosity, or a temperature of resin 110. For instance, as discussed in this first embodiment, when platen 152 applies a pressure of 40 kg/cm$^2$, resin 110 attains a status of flow-start viscosity 217 at which resin 110 starts flowing at temperature 211. In other words, resin 110 keeps a board-like status at a temperature ranging from room temperature to temperature 211 (first temperature range 213) and does not flow. When resin 110 receives the pressure of 40 kg/cm$^2$, flow-start viscosity is 24000 pas, and temperature 211 at this time is approx. 90° C.

Next, when the temperature exceeds temperature 211, the viscosity of resin 110 lowers to minimum viscosity 207 at temperature 206. Forcible flow-in step 122 is thus carried out in temperature range 214 (second temperature range) ranging from temperature 211 to temperature 206.

When step 122 is ended, resin 110 is hardened in heating and hardening step 123, in which platen 152 keeps applying the pressure of 40 kg/cm$^2$. Epoxy resin 110 starts hardening gradually when its temperature falls within temperature range 215 (third temperature range) exceeding temperature 206, and its viscosity reaches flow-start viscosity 212, where it loses the fluidity, at temperature 216. Under the pressure applied in this embodiment, resin 110 loses its fluidity at 150° C., where its viscosity is 24000 pa·s.

As discussed above, setting of the temperatures, such as a smaller temperature-rise in forcible flow-in step 122 than that in heating and softening step 120, and the temperature in step 122 falling between temperature 211 (flow-start viscosity 217) and temperature 206 (minimum viscosity 207), can obtain the following advantage: Resin 110 can maintain its viscosity, which allows resin 110 to flow into space 156 with ease at a specified pressure, for a long time. As a result, resin 110 is moved forcibly by pressure, so that hole 142 and space 156 are positively filled up with resin 110.

Figure 15:
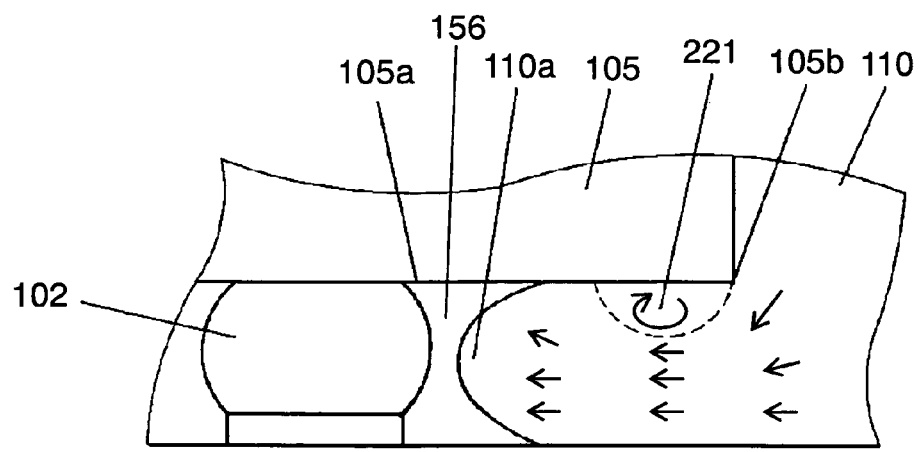
FIG. 15 shows an enlarged view of a space formed around a semiconductor element in accordance with the first embodiment.
Figure 16A:
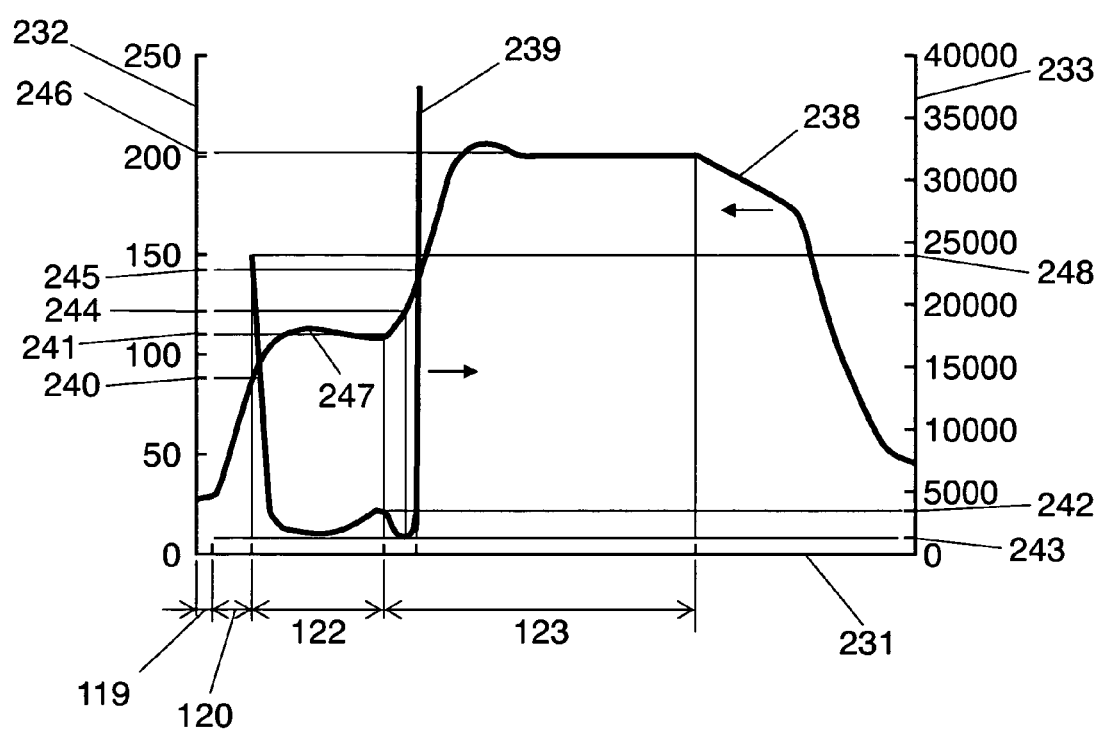
FIG. 16A shows temperature characteristics in the unifying step in accordance with the first embodiment.
Figure 16B:
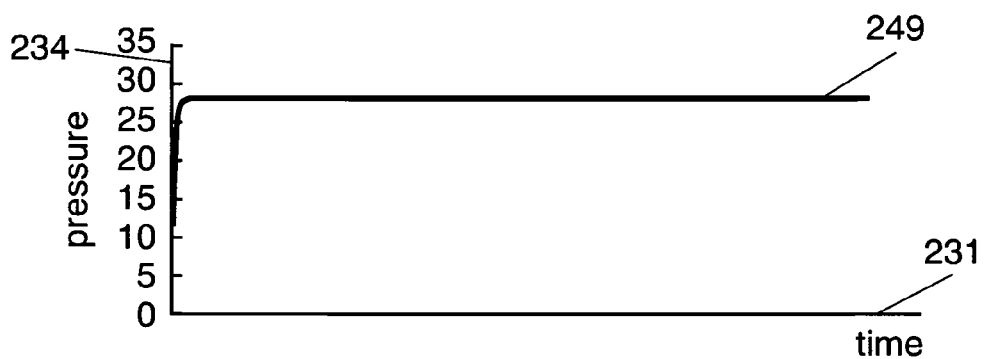
FIG. 16B shows pressure characteristics in the unifying step in accordance with the first embodiment.
Figure 16C:
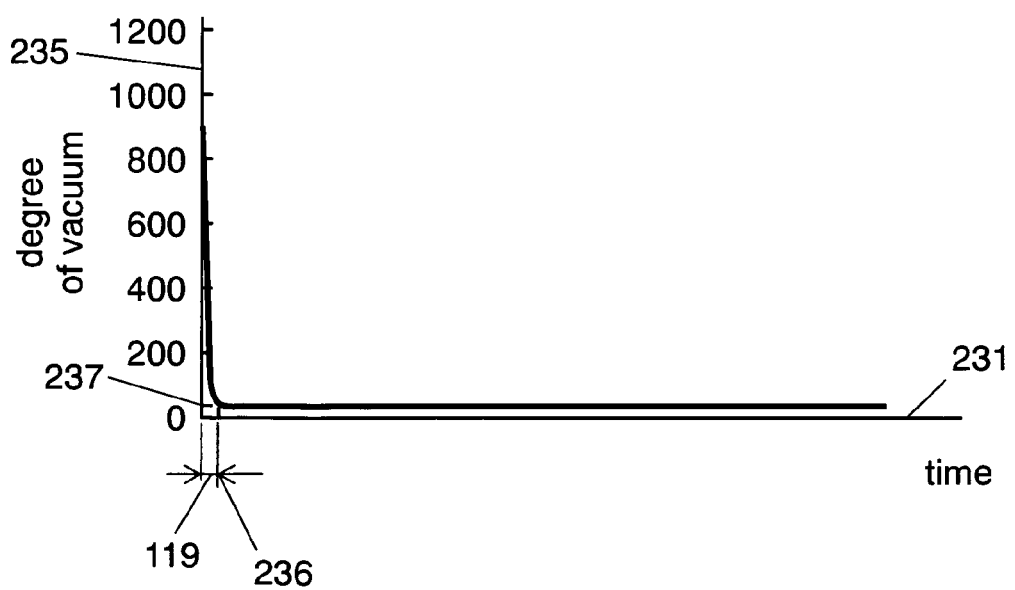
FIG. 16C shows atmospheric-pressure characteristics in the unifying step in accordance with the first embodiment.

The flow of the epoxy resin into space 156 is demonstrated with reference to FIG. 15 and FIGS. 16A-16C. FIG. 15 shows an enlarged view of semiconductor element 105 in the forcible flow-in step in accordance with the first embodiment. FIG. 16A-16C show characteristics in unifying step 118 in accordance with the first embodiment.

FIG. 10 shows resin 110 prior to compression, and resin 110 becomes fluid due to the compression by platen 152, and then its tip, namely, resin 110a, flows into space 156. At this time, space 156 is so much smaller than clearance 144 that resin 110a can be considered viscous fluid passing through a thin tube. Therefore, eddy 221 occurs near corner 105b, thereby inviting pressure loss.

The presence of solder bump 102 allows resin 110 to be considered viscous fluid passing through a thick tube after passing through the thin tube. In other words, resin 110 passing near solder bump 102 passes through thin tubes and thick tubes repeatedly, which invites a large amount of pressure loss, so that the flow speed of resin 110 slows down. It is important to increase the flow speed of resin 110 as much as possible so as not to stop the flow of resin 110.

To achieve this objective, the present invention provides fluid-resin embedding section 108a with substrate 109a made of glass woven fabric, and a cross sectional area through which resin 110 flows is reduced in the area where substrate 109a exists. This preparation allows resin 110 to resist moving within substrate 109a along arrow mark B show in FIG. 8. Since pre-preg 141 has hole 142, the compressing force in unifying step 118 is concentrated to substrate 109a and resin 110. On top of that, compressed resin 110 flows through a space having a small sectional area and sandwiched between substrates 109a. This mechanism allows resin 110 to flow at a higher speed with respect to a compressed amount (or a compressing pressure) by platen 152. As a result, inertia force generated by a flow-speed of resin 110 becomes greater than viscous force of resin 110, so that the flow-speed of resin 110 is considered to be accelerated. As a result, the flow-speed of resin 110 becomes greater, so that resin 110 flows into clearance 144 and space 156 more positively.

The relation between temperatures and pressures in unifying step 118 in accordance with the first embodiment is detailed with reference to FIGS. 16A-16C. FIG. 16A shows relations between time, resin temperature and resin viscosity, FIG. 16B shows relation between time and pressure, and FIG. 16C shows relation between time and degrees of vacuum. In these drawings, lateral axis 231 represents the time (minutes), and first vertical axis 232 represents the temperature (° C.) and second vertical axis 233 represents the viscosity (pa·s) of FIG. 16A. Vertical axis 234 of FIG. 16B represents the pressure (kg/cm²), and vertical axis 235 of FIG. 16C represents the degree of vacuum (torr).

As shown in FIG. 16C, it is assumed that degree of vacuum 237 is achieved at time 236 in evacuating step 119. To be more specific, time 236 spans approx. 4 minutes, and degree of vacuum 237 is approx. 37 torr. At the same time, the pressure starts being applied to pre-preg 141, and the pressure reaches the specified value of 40 kg/cm² in one minute. Heaters 160 start heating simultaneously.

In FIG. 16A, curve 238 shows the temperature of pre-preg 141, and curve 239 shows the viscosity of resin 110. In heating and softening step 120 after evacuating step 119, the temperature is raised to temperature 240 in order to make resin 110 fluid. Temperature 240 is approx. 90° C. in this embodiment, and resin 110 is heated at a rate of approx. 4.5° C./minute so that the temperature reaches temperature 240 in approx. 15 minutes, and the viscosity lowers to viscosity 248. The viscosity of resin 110 used in this embodiment becomes approx. 24000 pa·s at 90° C., and resin 110 starts flowing at this viscosity with respect to the pressure of 40 kg/cm² applied by platen 152.

Forcible flow-in step 122 is carried out after the viscosity of resin 110 is lowered to a fluid level in step 120. In step 122, the temperature is further raised to temperature 241 while pressure 249 continues to be supplied, and temperature 241 is maintained for approx. 30 minutes to allow resin 110 to forcibly flow into space 156. In step 120, it is preferable to heat resin 110 as quick as possible so that the viscosity lowers to not higher than viscosity 248, and in step 122, it is preferable to maintain the temperature of resin 110 at temperature 241. These operations allow delaying the progress of thermosetting reaction of resin 110 and maintaining the viscosity at a low level for a long period.

The foregoing operations allow resin 110 to stay in fluid status even 30 minutes after the viscosity passes across viscosity 248, and pressure 249 allows resin 110 to positively flow into space 156. Temperature 241 is approx. 110° C., and viscosity 242 is approx. 3550 pa·s.

A pressure applied to resin 110 at the start of being fluid is preferably greater than that applied upon losing its fluidity, because a greater pressure produces a greater flow-speed of resin 110 flowing into clearance 144 and space 156, which are thus positively filled with resin 110.

Pre-preg 141 layered in layering step 116 is provided with clearance 144 around or above semiconductor element 105 and resistor 106. To be more specific, the pressure applied from platen 152 in unifying step 118a is concentrated to pre-preg 141 at its face 146 (shown in FIG. 8) except hole 142, so that resin 110 receives a pressure greater than the pressure supplied from platen 152.

Hole 142 is not prepared for semiconductor element 105 and resistor 106 individually, but it is prepared for surrounding all these elements, so that hole 142 occupies almost a half area of board 101. As a result, pressure as much as twice of the pressure (40 kg/cm²) supplied from platen 152 can be applied to resin 110, namely 80 kg/cm² is applied to resin 110. This mechanism allows resin 110 to become fluid at a greater viscosity (or a lower temperature) than flow-start viscosity 212, so that a fluidable period can be prolonged. In forcible flow-in step 122, resin 110 can be positively charged into clearance 144 and space 156 with more ease.

Heating and hardening step 123 follows forcible flow-in step 122 where space 156 is filled up with resin 110. In step 123, the temperature of resin 110 is raised over temperature 245 at which resin 110 loses it fluidity under pressure 249, so that resin 110 becomes non-fluid, i.e. does not move in the least. In this embodiment, the viscosity at which resin 110 loses it fluidity under pressure 249 is almost the same as viscosity 248 at which the fluidity starts working, so that the viscosity is approx. 24000 pa·s. In heating and hardening step 123, the temperature of resin 110 is raised to 200° C., and resin 110 is kept at this temperature for approx. 60 minutes to be hardened completely.

Use of the method of manufacturing the component-embedded PWB discussed above allows the flow-speed of resin 110 to be faster by providing substrate 109*a*, so that resin 110 can flow into spaces 156, 157 between semiconductor element 105, resistor 106 and circuit board 101 with ease. This manufacturing method thus allows charging resin 110 positively into the spaces between semiconductor element 105, resistor 106 and circuit board 101 without using any intermediate members. This method does not require putting intermediate members into spaces 156, 157 between semiconductor element 105, resistor 106 and circuit board 101. In unifying step 118, pre-preg 141 and circuit board 101 are unified together, and at the same time, spaces 156, 157 can be positively filled up with resin 110. The present invention thus can provide the forgoing method of manufacturing the component-embedded PWB.

The foregoing method does not need a step of putting intermediate members or the intermediate members per se, so that an inexpensive component-embedded PWB is obtainable. Further, in forcible flow-in step 122, small spaces 156, 157 can be positively filled up with resin 110, so that few voids occur and a reliable component-embedded PWB is obtainable.

Complete fill-up of clearance 144, spaces 156, 157 with resin 110 allows supplying the pressure from platen 152 both to face 146 (shown in FIG. 8) and the resin charged into hole 142, so that a greater area of the resin receives the pressure, and as a result, resin 110 receives a smaller pressure. In this embodiment, the pressure received becomes half. The presence of hole 142 having clearance 144 with respect to semiconductor element 105 and resistor 106 can advantageously prolong the fluid period of resin 110. On top of that, the pressure supplied to platen 152 can be reduced when the resin starts being fluid, so that the driver can be downsized, which makes the device smaller and inexpensive.

In this embodiment, platen 152 can apply a pressure of as much as 40 kg/cm² for compressing because of the following structure: In layering step 116, pre-preg 141 is layered such that hole 142 exists over semiconductor element 105 and resistor 106, so that platen 152 cannot apply its pressure directly to semiconductor element 105 or resistor 106. Since the foregoing great pressure can be supplied, resin 110 is positively charged into clearance 144 and space 156.

Since pre-preg 141 is made of thermosetting resin, once it is heated and hardened, it never returns to plastic status even if it is heated again. Thus once semiconductor element 105 is sealed by resin 110, it keeps being fixed. The glass woven fabric is impregnated with epoxy resin, so that when resin 110 becomes fluid in heating and softening step 120 and forcible flow-in step 122, pre-preg 141 can keep its shape as a substrate, so that a component-embedded PWB having dimensional accuracy is obtainable.

It is important to lower temperature 245 of resin 110, at which temperature resin 110 loses its fluidity, lower than the melting point of solder 107 under pressure 249. Because resin 110 should be hardened before solder 107 is melted through the heat application in heating and softening step 123. To be more specific, resin 110 stays hardened and covers solder 107, so that solder 107 never flows out when it is melted. This structure improves reliability.

Temperature 246 (shown in FIG. 16A) in heating and hardening step 123 is kept lower than the melting point of solder 107. In other words, solder 107 employs high-temperature solder of which melting point is higher than the temperature maintained in step 123. This preparation allows solder 107 not to be melted by the heat supplied from step 123, so that a more reliable component-embedded PWB is obtainable.

The temperature maintained in the forcible flow-in step is low enough (e.g. 150° C.) not to melt the solder which connects and fixes semiconductor element 105 and resistors 106, and yet circuit board 101 and pre-preg 141 are unified together at the temperature maintained. This unification thus does not break the connection or the fixation. As a result, semiconductor element 105 and resistor 106 can be kept in strong connection and fixation.

Semiconductor element 105 and resistor 106 are mounted on circuit board 101, so that an inspection can be carried out for this circuit board 101 with the components mounted. As a result, a non-defective rate after completing the component-embedded PWB can be improved.

In this embodiment, a plurality of pre-pregs 141 are layered one after another; however, substrates 109*a* can be layered independently and resins 110 can be layered also independently. In such a case, the flow-speed of resin 110 can be changed appropriately in response to a thickness of the component-embedded PWB.

In forcible flow-in step 122, as shown in FIG. 16A, overshooting temperature range 247 which temporarily exceeds temperature 241 is provided. This preparation allows the temperature in heating and softening step 120 to rise more quickly, so that the viscosity of resin 110 lowers quickly. Thus the low viscosity can be kept for a long period in forcible flow-in step 122, and the fluidity of resin 110 can be improved. The highest temperature in overshooting temperature range 247 is 115° C., and this highest temperature is preferably set lower than temperature 244 (125° C. in this embodiment) at which resin 110 starts being hardened by the pressure supplied.

In layering step 116, the amount of resin 110 to be layered on circuit board 101 should be a greater amount than a fill-up amount of the resin charged into clearance 144, and spaces 156, 157. Because even if pre-preg 141 has dispersion in thickness, substrate 109*a* has dispersion, or the condition such as pressure or temperature has dispersion, clearance 144 and spaces 156, 157 should be positively filled up with resin 110. However, if too much resin is supplied, a large amount of resin 110 sticks out wastefully to the outside of board 101. To overcome this possible problem, this embodiment uses substrate 109*a*, which accelerates the flow-speed of resin 110, so that clearance 144 and spaces 156, 157 can be filled up with resin 110 leaving as little as possible left over.

The surplus supply of resin 110 sometimes increases the resin pressure in clearance 144 and spaces 156, 157 in unifying step 118*a*, and the resin pressure remains as stress, which generates warp. If the stress becomes excessive, it can damage the components. To overcome this possible problem, the compression to be done in unifying step 118*a* should be carried out such that resin layers 110 can be formed between substrate 109*a* and board 101, between substrates 109*a* themselves, and between substrate 109*a* and copper foil 145. Such compression allows resin 110 supplied excessively to flow toward the outside of board 101 with ease.

In other words, solid contact is not allowed between substrate 109*a* and board 101, between substrates 109 themselves, and between substrate 109*a* and copper foil 145. Thus when substrate 109*a* is compressed, surplus resin passes through these resin layers 110 toward the outside of board 101. This structure allows the resin pressure in clearance 144 and space 156 to increase by a smaller amount in unifying step 118a, so that warp or damage to the component rarely occurs.

As discussed above, substrate-included resin section 109 is formed by layering plural substrates 109a and plural resins 110b and 110c alternately. Meanwhile, substrate 109a is used as an example of the resin flow-speed accelerator, and both of resins 110b and 110c are used as examples of bonding resin. A fluid period of resin 110 is prolonged or a pressure applied to resin 110 is changed in response to the heating condition. As a result, resin 110 flows into hole 142 with ease, so that the spaces between semiconductor element 105 and resistor 106 can be filled up thoroughly with the resin without providing, for example, a substrate which is conventionally disposed between semiconductor element 105 and resistor 106. The complete fill-up of the spaces with the resin allows covering semiconductor element 105 and resistor 106 with the resin, so that these two components are insulated from each other. As a result, the space between these two components can be reduced, and a highly dense mounting of electronic components can be expected, which allows downsizing of the component-embedded PWB, and a module employing this PWB can be also advantageously downsized.

Embodiment 2

Figure 17:
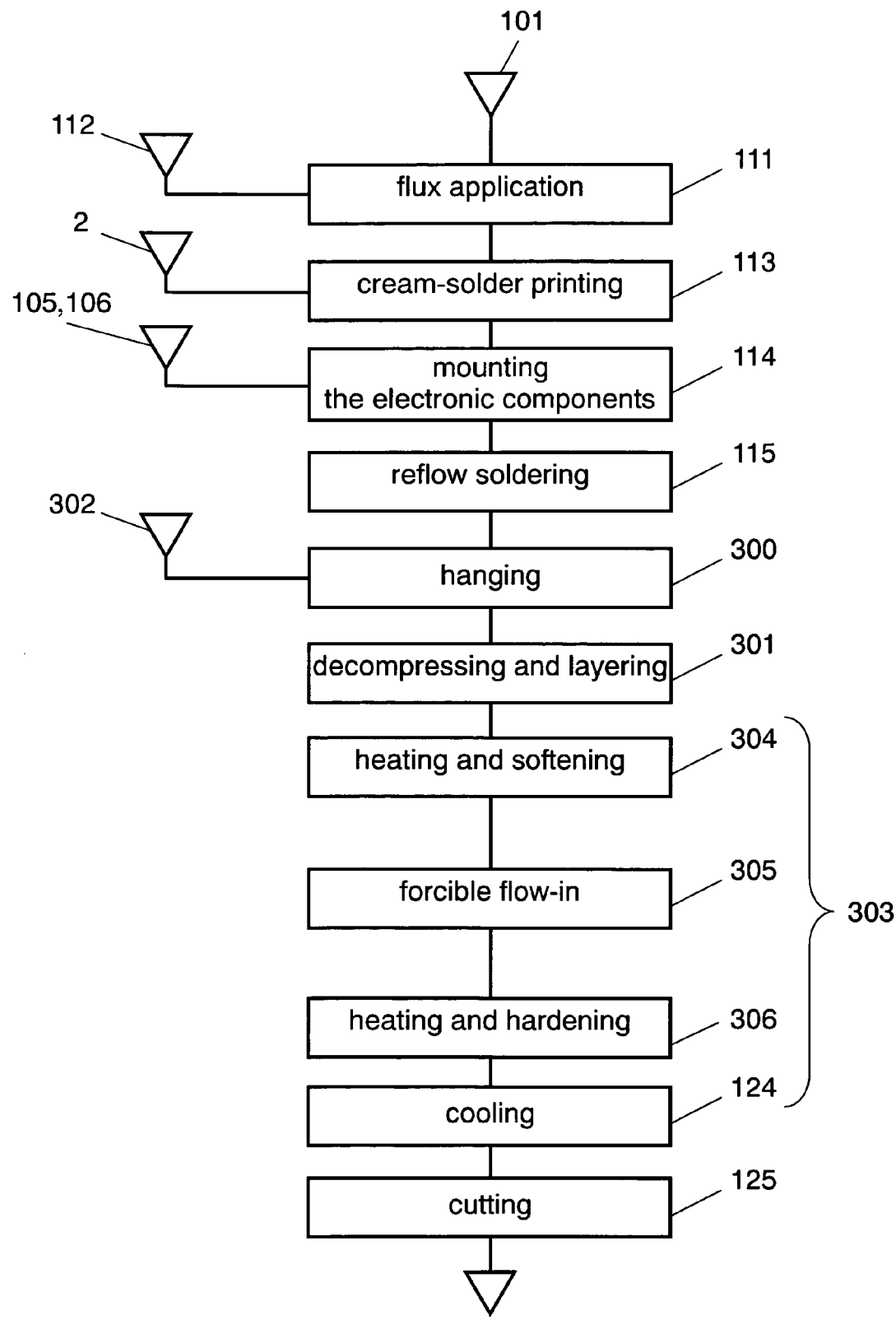
FIG. 17 shows a flowchart illustrating the steps of manufacturing a component-embedded PWB in accordance with second and third embodiments.

The second embodiment of the present invention is demonstrated hereinafter with reference to FIGS. 17-20. FIG. 17 shows a flowchart illustrating the steps of manufacturing a component-embedded printed wiring board (PWB) in accordance with this second embodiment. In FIGS. 17-20, similar elements to those shown in FIGS. 1-12 have the same reference marks, and the descriptions thereof are simplified here. In the first embodiment previously discussed, six sheets of pre-pregs 141 are layered on circuit board 101; however, in this embodiment, only one sheet of pre-preg having a thickness of approx. 1 mm is layered on circuit board 101. The respective steps are detailed hereinafter following the sequence of the steps shown in FIG. 17.

In this second embodiment, as the first embodiment demonstrates, semiconductor element 105 and resistor 106 are mounted on circuit board 101, and they undergo the soldering in reflow soldering step 115. After step 115, hanging step 300 is prepared for hanging pre-preg 302 over circuit board 101. Hanging step 300 is followed by decompressing and layering step 301. Pre-preg 302 is used as an example of a sheet.

Figure 18:
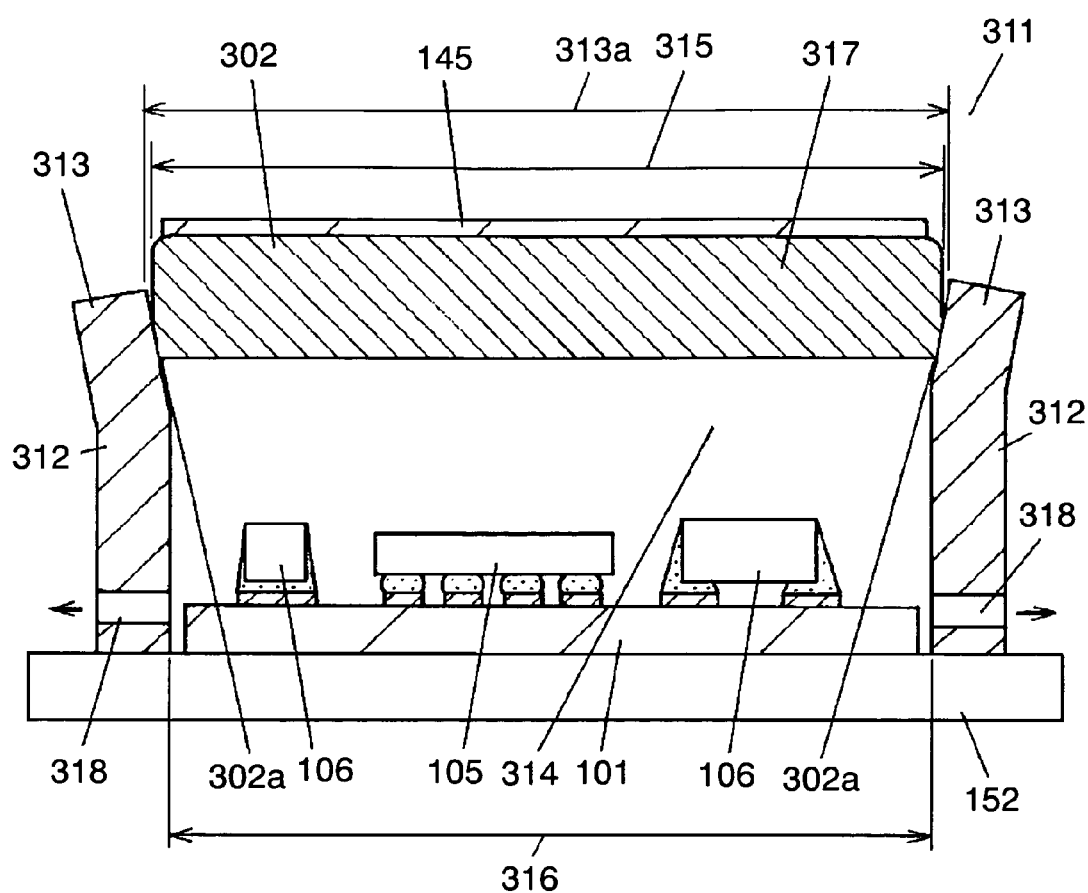
FIG. 18 shows a sectional view of a hanging device in accordance with the second embodiment.
Figure 19:
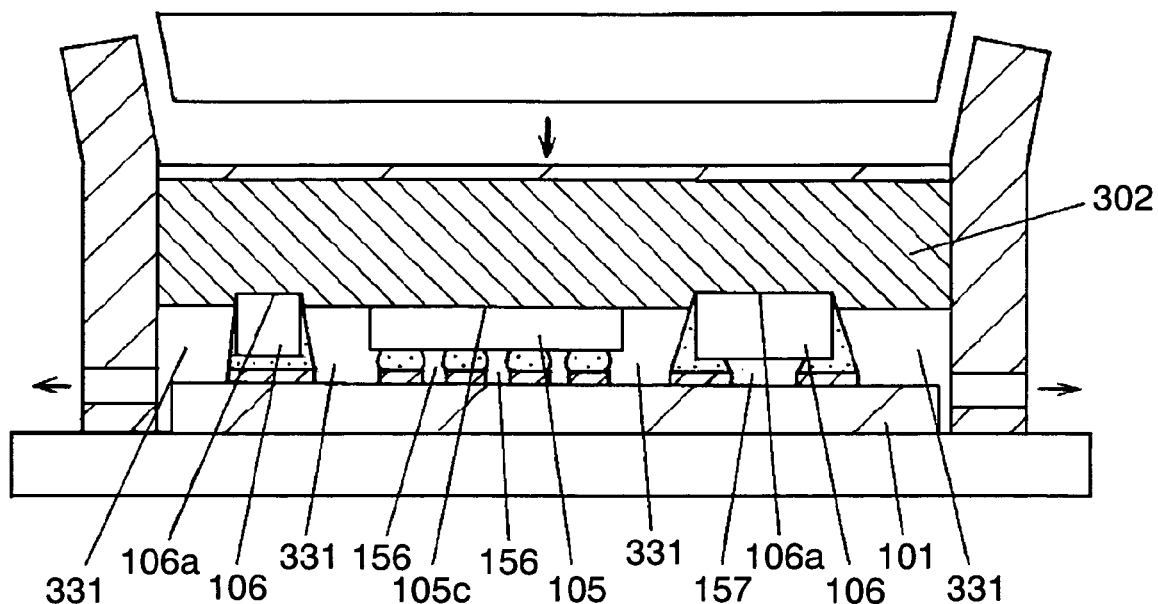
FIG. 19 shows a sectional view of a decompressing and layering device in accordance with the second embodiment.

Hanging step 300, and decompressing and layering step 301 are demonstrated with reference to FIGS. 18 and 19. FIG. 18 shows a sectional view of a hanging device in accordance with the second embodiment. FIG. 19 shows a sectional view of a decompressing and layering device in accordance with the second embodiment.

First, hanging step 300 is described. In FIG. 18, airtight container 311 includes platen 152, guide 312 surrounding lateral faces of circuit board 101, slope 313 disposed to the upper end of guide 312, and opening 314 existing over guide 312. Airtight container 311 is used as an example of an airtight device, and platen 152 is used as an example of a compressing device.

Circuit board 101 is inserted into guide 312 of airtight container 311. The clearance between guide 312 and board 101 is approx. 0.5 mm on each side, and guide 312 determines the position of board 101.

Pre-preg 302 is placed such that it covers opening 314. Width 315 of pre-preg 302 should be greater than width 316 of guide 312 and yet smaller than opening size 313a of slope 313. Such dimensions allow pre-preg 302 to be hung by slope 313 in hanging step 300. Copper foil 145 is layered on pre-preg 302. To be more specific, slope 313 hangs pre-preg 302 so that pre-preg 302 cannot touch semiconductor element 105 or resistor 106 because this hanging-up provides a clearance between the underside of pre-preg 302 and the top face of semiconductor element 105 or resistor 106. Slope 313 thus works as a hanging device.

Pre-preg 302 used in this second embodiment employs epoxy resin 317 in a liquid state, i.e. having a viscosity, at a room temperature, because quicker lowering in viscosity needs less heating, so that a component-embedded PWB can be produced with less energy. Tip 302a of pre-preg 302 thus closely contacts slope 313, so that an airtight space is formed by platen 152, guide 312, slope 313 and pre-preg 302. In other words, pre-preg 302 per se works as a lid of airtight container 311. Epoxy resin 317 can be replaced with thermosetting resin such as unsaturated polyester resin.

A sucking device (not shown) sucks the air from the airtight space covered with pre-preg 302 working as a lid through vent hole 318 provided to guide 312. Decompressing the airtight space makes the inside of container 311 negatively pressurized, so that pre-preg 302 lowers along slope 313 and guide 312.

In this second embodiment, vent hole 318 is provided near the lower end of guide 312, and it is preferable to provide hole 318 at a place lower than pre-preg 302 is supposed to sink through decompression. This structure prevents pre-preg 302 from covering vent hole 318 when the air is sucked through vent hole 318, so that container 311 can be evacuated positively.

FIG. 19 shows a sectional view of a decompressing and layering device in accordance with the second embodiment. As shown in FIG. 19, pre-preg 302 stops lowering when it touches top face 105c of the semiconductor element or top face 106a of the resistor, so that pre-preg 302 is layered over circuit board 101. Pre-preg 302 is thus held in a negatively pressurized status due to the evacuating.

Evacuating the airtight container leaves no bubbles containing air between pre-preg 302 and semiconductor element 105 or resistor 106, so that more solid contact can be expected between pre-preg 302 and top face 105c of element 105 or top face 106a of resistor 106. As a result, a reliable component-embedded PWB is obtainable.

Figure 20:
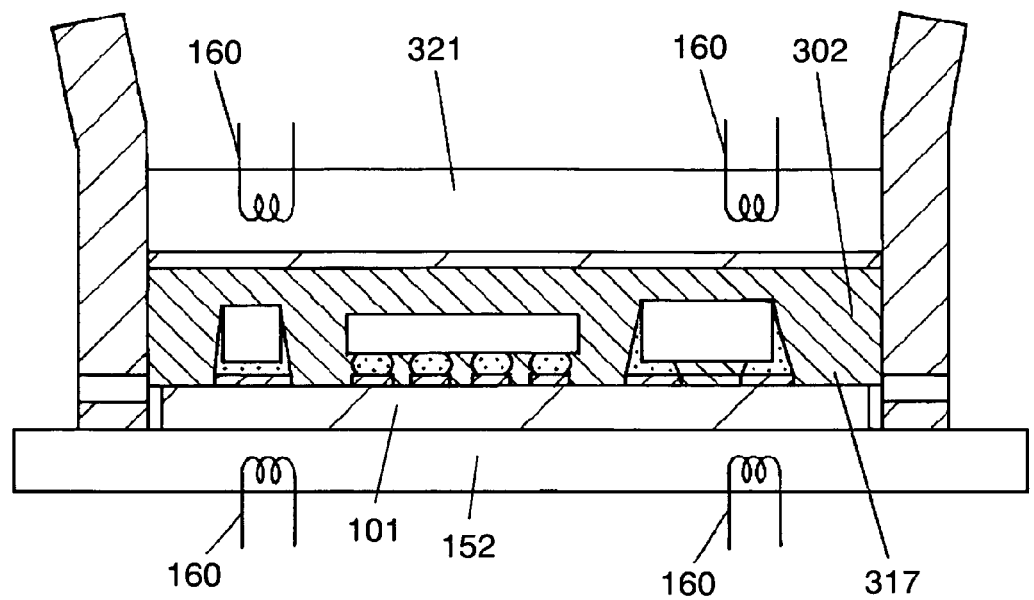
FIG. 20 show a sectional view of the component-embedded PWB used in a unifying step in accordance with the second embodiment.

FIG. 20 show a sectional view of a unifying device to be used in unifying step 303 which follows the compressing and layering step in accordance with the second embodiment. In unifying step 303, upper platen 321 heats, compresses, and cools pre-preg 302, thereby charging epoxy resin 317 into spaces 156, 157, and unifying circuit board 101 and pre-preg 302 together.

The first step of unifying step 303 is heating and softening step 304 which follows decompressing and layering step 301. In step 304, heaters 160 provided to platen 152 and upper platen 321 apply heat to pre-preg 302 so that pre-preg 302 is softened to be fluid. Since pre-preg 302 employs fluid material at a room temperature, step 304 needs less heat, i.e. energy can be saved.

In forcible flow-in step 305 following step 304, epoxy resin 317 flows in as it does in the first embodiment. In this second embodiment, it is also important to move platen 321 in order to prevent epoxy resin 317 flowing into spaces 156, 157 from being heated over the temperature, at which the resin starts hardening, by frictional heat or pressure loss due to the flow-in. In step 305, epoxy resin 317 is forcibly charged into spaces 156, 157 at approx. 100° C., so that there is no need to charge an intermediate member into spaces 156, 157 in another step.

Epoxy resin 317 starts hardening at a temperature ranging from 110° C. to 150° C. This embodiment uses epoxy resin 317 that starts a thermosetting reaction when the resin is held for approx. 10 minutes in the foregoing temperature range.

In this second embodiment, pre-preg 302 does not have a hole, so that spaces 331 formed around semiconductor element 105 and resistor 106 are greater than clearances 143, 144 formed in the first embodiment. Thus the temperature in forcible flow-in step 305 is set at 100° C., thereby charging epoxy resin 317 positively into spaces 331, 156, 157.

Step 305 is followed by heating and hardening step 306. In step 306, epoxy resin 317 is heated to 150° C. to be completely hardened, and then hardened resin 317 is cooled gradually in cooling step 124 and is cut in cutting step 125 following step 124.

In the second embodiment, it is also important to set a temperature rising rate in step 305 smaller than that in step 304. This preparation allows lowering the viscosity of pre-preg 141 quickly and minimizing the viscosity, so that the resin is positively charged into the spaces in step 305.

Compressing and layering step 301 is carried out ahead of unifying step 303, so that no bubbles containing air remain between pre-preg 302 and semiconductor element 105 or resistor 106, and more solid contact can be expected between pre-preg 302 and top face 105c of semiconductor element 105 or top face 106a of resistor 106. As a result, a reliable component-embedded PWB is obtainable.

Pre-preg 302 does not need a hole corresponding to semiconductor element 105 and resistor 106 as it is needed in the first embodiment, so that hole-opening step 117 in the first embodiment is not needed here. As a result, an inexpensive component-embedded PWB is obtainable.

In this second embodiment, holes in response to heights of respective components are not needed, so that one sheet of pre-preg 302 can work sufficiently. Thus only one sheet of pre-preg 302 is layered, which lowers the cost of the component-embedded PWB.

Further, pre-preg 302 can be just placed over slope 313, so that layering work can be simplified, which also reduces the cost of the component-embedded PWB.

In addition, vent holes 318 are provided to guide 312, so that the clearance between board 101 and guide 312 can be narrowed. Guide 312 thus accurately determines the position of board 101, and also prevents pre-preg 302 from flowing out to the outside. This structure allows epoxy resin 317 to flow into spaces 331, 156, 157, thereby positively charging these spaces with resin 317 so as to be free of voids.

Embodiment 3

In the third embodiment, another instance of the decompressing and layering device described in the second embodiment is demonstrated, and this other device can replace the one used in the second embodiment. The respective manufacturing steps in the third embodiment remain unchanged from those in the second embodiment. Thus only this replaceable decompressing and layering device is described hereinafter.

Figure 21:
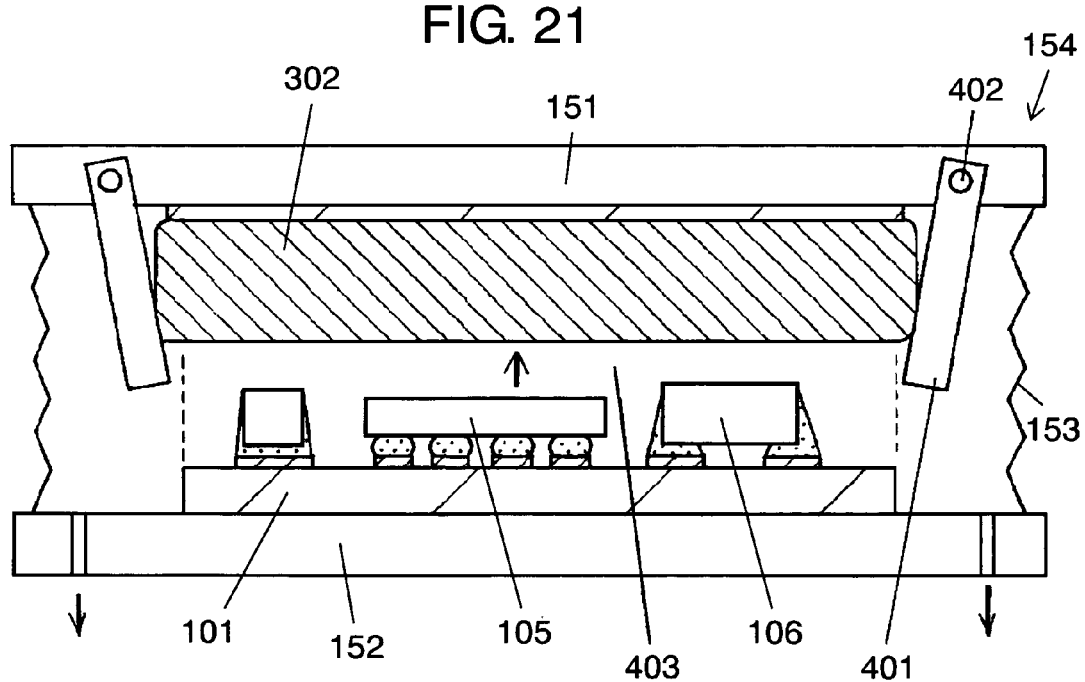
FIG. 21 shows a sectional view of a decompressing and layering device in accordance with the third embodiment.
Figure 22:
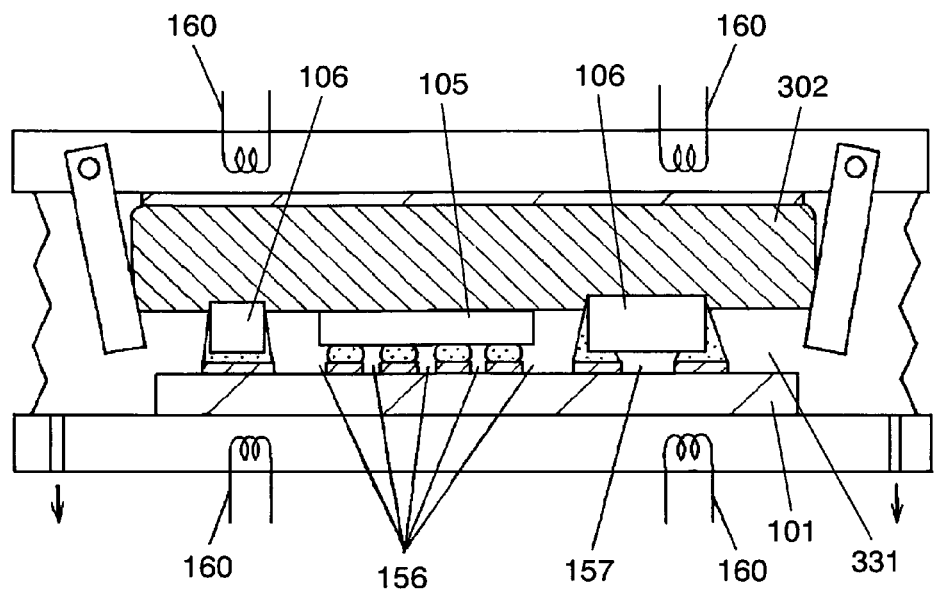
FIG. 22 shows another sectional view of the decompressing and layering device in accordance with the third embodiment.
Figure 23:
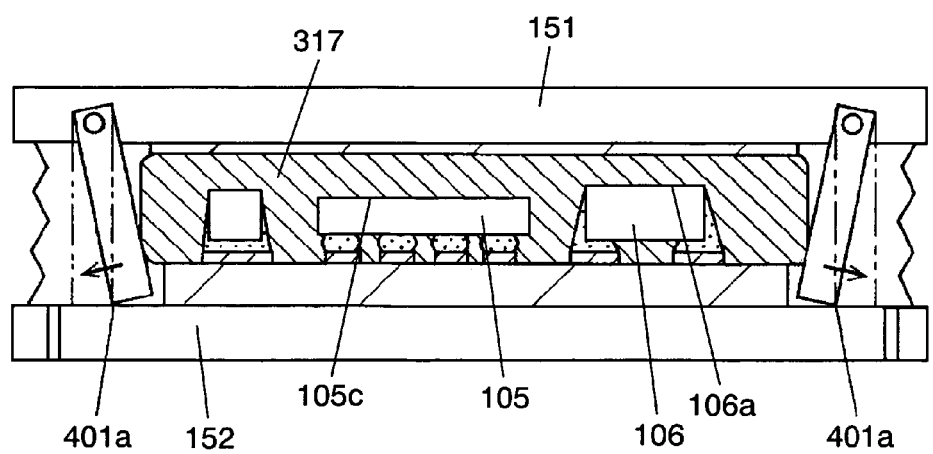
FIG. 23 shows a sectional view of the component-embedded PWB in the forcible flow-in step in accordance with the third embodiment.

FIGS. 21 and 22 show sectional views of the decompressing and layering device used in the decompressing and layering step in accordance with the third embodiment. FIG. 23 shows a sectional view of the component-embedded PWB in the forcible flow-in step of the third embodiment. In these drawings, elements similar to those used in FIG. 1-FIG. 20 sometimes have the same reference marks, and in such cases the descriptions thereof are simplified.

In FIG. 21, platens 151, 152 and expandable wall 153 form airtight container 154. Circuit board 101, on which semiconductor element 105 and resistor 106 have been reflow-soldered, is mounted to platen 152 at a given place. Airtight container 154 is used as an example of an airtight device.

Platen 151 has holding gadget 401 mounted rotatably on shaft 402, and holding gadget 401 is urged inward by springs (not shown), thereby pinching pre-preg 302 at both sides. Holding gadget 401 and platen 151 hold pre-preg 302 such that pre-preg 302 confronts circuit board 101.

Platen 151 and holding gadget 401 form a hanging device, thereby preventing pre-preg 302 from touching semiconductor element 105 or resistor 106. This structure allows forming clearance 403 between underside of pre-preg 302 and top face of semiconductor element 105 or resistor 106. A sucking device (not shown) sucks the air from the airtight container through vent holes 155, so that the container is decompressed and evacuated, which makes container 154 negatively pressurized, thereby raising platen 152.

FIG. 22 shows a sectional view of the decompressing and layering device used in the decompressing and layering step in accordance with the third embodiment. As shown in FIG. 21, due to the evacuating, pre-preg 302 is halted keeping in touch with the top faces of semiconductor element 105 and resistor 106, so that pre-preg 302 is layered over the circuit board 101. Pre-preg 302 is thus held in negative pressurized status due to the evacuating.

Thus no bubbles containing air remain between pre-preg 302 and semiconductor element 105 or resistor 106, and more solid contact can be expected between pre-preg 302 and top face 105c of semiconductor element 105 or top face 106a of resistor 106. As a result, a reliable component-embedded PWB is obtainable.

FIG. 23 shows a sectional view of a unifying device used in unifying step 303. As shown in FIG. 22, in unifying step 303, upper platen 151 heats, compresses, and cools pre-preg 302, thereby charging epoxy resin 317 into spaces 156, 157, and unifying circuit board 101 and pre-preg 302 together. In this case, tip 401a of holding gadget 401 stops when it touches platen 152. In other words, holding gadget 401 also works as stopper 161 described in the first embodiment.

In this third embodiment, holding gadget 401 is placed such that it covers the entire periphery of pre-preg 302, so that holding gadget 401 prevents fluid epoxy resin 317 from flowing out to the outside in unifying step 303. Epoxy resin 317 thus flows into spaces 331, 156, 157, thereby inviting no voids.

As a result, these spaces are positively filled up with resin 317. Since less amount of pre-preg 302 flows out to the outside, the pre-preg can be downsized proportionately, which can reduce an amount of pre-preg 302, and an inexpensive component-embedded PWB is obtainable. In general, the thermosetting resin cannot be reused once it is hardened, so that the reduction of the amount of pre-preg 302 can contribute to environmental protection.

When unifying step 303 ends its operation, holding gadget 401 moves outward (along the arrow mark shown in FIG. 22) for releasing pre-preg 302, so that platen 151 can move upward and circuit board 101 can be taken out.

Compressing and layering step 301 is carried out ahead of unifying step 303, so that no bubbles containing air remain between pre-preg 302 and semiconductor element 105 or resistor 106, and more solid contact can be expected between pre-preg 302 and top face 105c of semiconductor element 105 or top face 106a of resistor 106. As a result, a reliable component-embedded PWB is obtainable.

Pre-preg 302 does not need a hole corresponding to semiconductor element 105 and resistor 106 as it is needed in the first embodiment, so that hole-opening step 117 in the first embodiment is not needed here. As a result, an inexpensive component-embedded PWB is obtainable.

In this third embodiment, holes in response to heights of respective components are not needed, so that one sheet of pre-preg 302 can work sufficiently. Thus only one sheet of pre-preg 302 is layered, which reduces the cost of the component-embedded PWB.

Further, pre-preg 302 can be just pinched by holding gadget 401, so that layering work can be simplified, which also reduces the cost of the component-embedded PWB.

In this third embodiment, pre-preg 302 is hung; however, circuit board 101 can be hung instead. In such a case, a similar advantage to what is discussed above is also obtainable.

The component-embedded PWB of the present invention includes the following elements:
- a fluid-resin embedding section formed at a place corresponding to electronic components and covering the components;
- a resin flow-speed accelerator surrounding the fluid-resin embedding section and being disposed in parallel with a top face of a circuit board; and
- bonding resin disposed between the accelerator and the circuit board.

The embedding section is filled up with the same resin as the bonding resin. The foregoing structure allows the accelerator to compress the resin by a pressure applied when the component-embedded PWB is pressed, so that the resin can flow along the PWB with ease. The resin is thus charged into the fluid-resin embedding section in every nook and cranny, so that no air remains. As a result, the load produced by expanding the air does not damage the connections, so that the quality of the connections improves.

The component-embedded PWB and the manufacturing method of the same PWB of the present invention can advantageously provide reliable connections in the component-embedded PWB. Use of the same PWB as the boards, on which components are reflow-soldered, is useful.

What is claimed is:

1. A method of manufacturing a component-embedded printed wiring board in which a plurality of electronic components are embedded, the method comprising the steps of:
   providing a sheet made of resin and a resin flow-speed accelerator with a hole;
   mounting the plurality of electronic components on a top face of a circuit board;
   after the mounting step, layering the resin flow-speed accelerator on the sheet such that the hole surrounds periphery of the electronic components; and
   after the layering step, unifying the sheet and the circuit board together by heating and pressing;
   wherein the unifying step compresses a unit formed by laminating the circuit board and the resin flow-speed accelerator to move bonding resin disposed between the resin flow-speed accelerator and the circuit board to the hole, so that the hole is filled up with the bonding resin;
   wherein the sheet includes thermosetting resin which is shaped like a board within a first temperature range, and has thermal fluidity in a second temperature range higher than the first range, and is hardened in a third temperature range higher than the second range; and
   wherein the unifying step includes:
   (a-1) a first heating step for heating the sheet to the second temperature range and softening the resin, and then
   (a-2) a forcible flow-in step which forcibly charges the resin into a space formed between the electronic components and the circuit board by compressing the sheet before the sheet is heated to the third temperature range, and then
   (a-3) a second heating step for heating the sheet to the third temperature range,
   wherein the temperature rises slower in the forcible flow-in step than in the first heating step.

2. The method of manufacturing the component-embedded printed wiring board of claim 1, further comprising a step of unifying the sheet and the resin flow-speed accelerator together in advance.

3. The method of manufacturing the component-embedded printed wiring board of claim 1, wherein the resin flow-speed accelerator has the sheet on a face opposite to another face confronting the circuit board.

4. The method of manufacturing the component-embedded printed wiring board of claim 1, wherein the layering step layers a plurality of the resin flow-speed accelerators and a plurality of the sheets alternately.

5. The method of manufacturing the component-embedded printed wiring board of claim 4, wherein the unifying step applies pressure such that the resin layer is formed between the resin flow-speed accelerators.

6. The method of manufacturing the component-embedded printed wiring board of claim 1, wherein the unifying step applies pressure such that the resin layer is formed between the circuit board and the resin flow-speed accelerator.

7. The method of manufacturing the component-embedded printed wiring board of claim 1, wherein the sheet is shaped like a board and made of one of woven fabric impregnated with resin and non-woven fabric impregnated with resin.

8. The method of manufacturing the component-embedded printed wiring board of claim 1, wherein in the forcible flow-in step the sheet is kept at a first temperature lower than a second temperature at which a viscosity of the sheet becomes a minimum value, and the sheet and the circuit board are compressed together at the first temperature for charging the thermosetting resin into the space.

9. The method of manufacturing the component-embedded printed wiring board of claim 1, wherein a temperature of the sheet in the forcible flow-in step is set lower than a temperature, at which the viscosity of the sheet becomes a minimum value, by an amount of temperature rise of the resin due to being charged into the space.

10. The method of manufacturing the component-embedded printed wiring board of claim 1, wherein a temperature of the resin upon being charged into the space in the forcible flow-in step is set lower than a temperature at which a viscosity of the resin becomes a minimum value.

11. The method of manufacturing the component-embedded printed wiring board of claim 1, wherein a sheet in the forcible flow-in step is kept at a temperature at which the coupling and fixing member is not melted.

12. The method of manufacturing the component-embedded printed wiring board of claim 1, wherein a temperature of the sheet in the forcible flow-in step is set lower than a melting point of the coupling and fixing member at least by an amount of temperature rise of the resin due to being charged into the space.

13. The method of manufacturing the component-embedded printed wiring board of claim 1, wherein in the forcible flow-in step, a temperature of the resin to flow into the space is set lower than a melting point of the coupling and fixing member.

14. The method of manufacturing the component-embedded printed wiring board of claim 1, wherein a pressure applied in the forcible flow-in step is set small enough for a viscosity of the resin not to rise due to a temperature rise caused by friction between the resin and the electronic components or the circuit board when the resin flows into the space.

15. The method of manufacturing the component-embedded printed wiring board of claim 1, wherein the pressure applied in the forcible flow-in step is set small enough for a temperature of the resin not to exceed a melting point of the coupling and fixing member due to a temperature rise caused by friction between the resin and the electronic components or the circuit board when the resin flows into the space.

16. The method of manufacturing the component-embedded printed wiring board of claim 1, wherein a temperature of the sheet in the second heating step is set lower than a melting point of the coupling and fixing member.

17. The method of manufacturing the component-embedded printed wiring board of claim 1, wherein in the forcible flow-in step, the resin flows in the space, and this flow-in generates heat, which lowers a viscosity of the resin.

18. The method of manufacturing the component-embedded printed wiring board of claim 1, wherein a pressure applied in the forcible flow-in step is maintained.

19. The method of manufacturing the component-embedded printed wiring board of claim 1, wherein a degree of vacuum is maintained in the forcible flow-in step.

20. The method of manufacturing the component-embedded printed wiring board of claim 1, wherein in the forcible flow-in step, temperature characteristics of the resin includes an overshooting temperature range.

21. The method of manufacturing the component-embedded printed wiring board of claim 20, wherein a maximum temperature of the overshooting temperature range is lower than a temperature at which a viscosity of the resin becomes a minimum value.

22. The method of manufacturing the component-embedded printed wiring board of claim 20, wherein a maximum temperature in the overshooting temperature range is set lower than a temperature, at which a viscosity of the resin becomes a minimum value, by an amount greater than a temperature rise of the resin due to friction or decompression caused by flow-in of the resin into the space.

23. The method of manufacturing the component-embedded printed wiring board of claim 1, wherein a temperature of the resin is maintained in the forcible flow-in step.

24. The method of manufacturing a component-embedded printed wiring board of claim 1, wherein
the temperature rises quicker in the first heating step than in the second heating step.

* * * * *